United States Patent
Goto

(10) Patent No.: US 11,435,663 B2
(45) Date of Patent: Sep. 6, 2022

(54) CURABLE COMPOSITION FOR IMPRINTING, METHOD OF MANUFACTURING CURED PRODUCT PATTERN, METHOD OF MANUFACTURING CIRCUIT SUBSTRATE, AND CURED PRODUCT

(71) Applicant: FUJIFILM Corporation, Tokyo (JP)

(72) Inventor: Yuichiro Goto, Haibara-gun (JP)

(73) Assignee: FUJIFILM Corporation, Tokyo (JP)

( * ) Notice: Subject to any disclaimer, the term of this patent is extended or adjusted under 35 U.S.C. 154(b) by 0 days.

(21) Appl. No.: 16/826,565

(22) Filed: Mar. 23, 2020

(65) Prior Publication Data

US 2020/0241410 A1 Jul. 30, 2020

Related U.S. Application Data

(63) Continuation of application No. PCT/JP2018/035293, filed on Sep. 25, 2018.

(30) Foreign Application Priority Data

Sep. 27, 2017 (JP) .............................. JP2017-186091

(51) Int. Cl.

| | | |
|---|---|---|
| C08F 2/46 | (2006.01) | |
| C08F 2/50 | (2006.01) | |
| C08G 61/04 | (2006.01) | |
| G03F 7/00 | (2006.01) | |
| G03F 7/16 | (2006.01) | |
| G03F 7/20 | (2006.01) | |
| H05K 1/09 | (2006.01) | |
| G03F 7/027 | (2006.01) | |
| G03F 7/031 | (2006.01) | |
| G03F 7/075 | (2006.01) | |
| B81C 1/00 | (2006.01) | |
| B82Y 30/00 | (2011.01) | |

(52) U.S. Cl.
CPC ............ *G03F 7/0002* (2013.01); *G03F 7/027* (2013.01); *G03F 7/031* (2013.01); *G03F 7/0755* (2013.01); *G03F 7/162* (2013.01); *G03F 7/20* (2013.01); *H05K 1/09* (2013.01); *B81C 1/0046* (2013.01); *B82Y 30/00* (2013.01)

(58) Field of Classification Search
CPC .......... G03F 7/0755; G03F 7/20; G03F 7/031; G03F 7/162; G03F 7/0002; G03F 7/027; C08F 2/48; H01L 21/027; B29C 59/02; H05K 1/09; H05K 2203/0108; H05K 2203/0514; H05K 3/107; H05K 3/465
USPC ........................ 522/6, 189, 184, 71, 1; 520/1
See application file for complete search history.

(56) References Cited

U.S. PATENT DOCUMENTS

2014/0121292 A1* 5/2014 Kodama .................. C09D 4/00
522/64

FOREIGN PATENT DOCUMENTS

| JP | 2005-533393 A | 11/2005 |
|---|---|---|
| JP | 2010-016149 A | 1/2010 |
| JP | 2010-083970 A | 4/2010 |
| JP | 2011-159881 A | 8/2011 |
| JP | 2013-095833 A | 5/2013 |
| JP | 2013-163354 A | 8/2013 |
| JP | 2015-071741 A | 4/2015 |
| JP | 2016-66656 A | 4/2016 |
| JP | 2016066656 * | 4/2016 |
| JP | 2016-76660 A | 5/2016 |
| JP | 2016076660 * | 5/2016 |
| WO | 2004/016406 A1 | 2/2004 |
| WO | 2015/137438 A1 | 9/2015 |

OTHER PUBLICATIONS

Inoue et al, JP 2016066656 Machine Translation, Apr. 28, 2016 (Year: 2016).*
Sato et al, JP 2016076660 Machine Translation, May 12, 2016 (Year: 2016).*
International Search Report dated Dec. 11, 2018, by the International Searching Authority in application No. PCT/JP2018/035293.
Written Opinion dated Dec. 11, 2018, by the International Searching Authority in application No. PCT/JP2018/035293.
International Preliminary Report on Patentability dated Mar. 31, 2020, by the International Searching Authority in application No. PCT/JP2018/035293.
Office Action dated Oct. 19, 2021 from the Korean Intellectual Property Office in KR Application No. 10-2020-7008347.
Office Action dated Jan. 5, 2021, issued by the Japanese Patent Office in Japanese application No. 2019-545096.
Office Action dated Jul. 22, 2022 in Taiwanese Application No. 107133532.

* cited by examiner

*Primary Examiner* — Jessica Whiteley
(74) *Attorney, Agent, or Firm* — Sughrue Mion, PLLC

(57) ABSTRACT

A curable composition for imprinting satisfies the following A to C: A: the curable composition includes a polyfunctional polymerizable compound having a polymerizable group equivalent of 150 or higher; B: the curable composition includes a photopolymerization initiator; and C: the curable composition satisfies at least one of a condition that the content of an ultraviolet absorber in which the light absorption coefficient at a maximum emission wavelength of an irradiation light source is 1/2 or higher of the light absorption coefficient of the photopolymerization initiator is 0.5 to 8 mass % with respect to non-volatile components or a condition that the content of a polymerization inhibitor is 0.1 to 5 mass % with respect to the non-volatile components. The non-volatile components refer to components in the curable composition for imprinting other than a solvent.

17 Claims, 2 Drawing Sheets

CURABLE COMPOSITION FOR IMPRINTING, METHOD OF MANUFACTURING CURED PRODUCT PATTERN, METHOD OF MANUFACTURING CIRCUIT SUBSTRATE, AND CURED PRODUCT

CROSS-REFERENCE TO RELATED APPLICATIONS

This application is a Continuation of PCT International Application No. PCT/JP2018/035293 filed on Sep. 25, 2018, which claims priority under 35 U.S.C § 119(a) to Japanese Patent Application No. 2017-186091 filed on Sep. 27, 2017. Each of the above application(s) is hereby expressly incorporated by reference, in its entirety, into the present application.

BACKGROUND OF THE INVENTION

1. Field of the Invention

The present invention relates to a curable composition for imprinting, a method of manufacturing a cured product pattern, a method of manufacturing a circuit substrate, and a cured product.

2. Description of the Related Art

In an imprinting method, a curable composition is irradiated with light to be photocured through a light-transmitting mold or a light-transmitting substrate, and then the mold is released. As a result, a fine pattern is transferred to the photocured product. In this method, imprinting can be performed at room temperature. Therefore, the method is applicable to the precision machining field of ultrafine patterns such as preparation of semiconductor integrated circuits. Recently, the development of a new method such as a nanocasting method having advantageous effects of both methods together or a reversal imprinting method for manufacturing a three-dimensional laminate structure has been reported.

As the curable composition for imprinting, for example, compositions disclosed in JP2010-083970A, WO2015/137438A, JP2015-071741A, and JP2013-095833A are known.

On the other hand, as one imprinting method, a method called "Step and Flash Imprint Lithography System:S-FIL system) or "Step and Repeat Process" is known (JP2005-533393A).

SUMMARY OF THE INVENTION

In the step and repeat process, as described below in detail, light (flare light) may leak to an adjacent portion during exposure such that a curing reaction of a curable composition for imprinting in a peripheral region progresses. In this case, the imprinting of the cured adjacent portion does not progress appropriately such that defects of a pattern may occur. For curing control, for example, the exposure dose during imprinting may be reduced. In this case, however, a curable composition for imprinting in the exposed portion may be insufficiently cured, and defects such as collapse may occur in a transfer pattern.

An object of the present invention is to solve the above-described problems and to provide a curable composition for imprinting capable of inhibiting an excessive reaction caused by light leak, a method of manufacturing a cured product pattern, a method of manufacturing a circuit substrate, and a cured product.

The present inventor conducted an investigation in order to achieve the object and found that the object can be achieved by mixing a polyfunctional polymerizable compound, a photopolymerization initiator, and an ultraviolet absorber and/or a polymerization inhibitor in specific amounts. Specifically, the above-described object can be achieved using the following means <1>, preferably <2> to <15>.

<1> A curable composition for imprinting that satisfies the following A to C:

A: the curable composition comprises a polyfunctional polymerizable compound having a polymerizable group equivalent of 150 or higher;

B: the curable composition comprises a photopolymerization initiator; and

C: the curable composition satisfies at least one of a condition that a content of an ultraviolet absorber in which a light absorption coefficient at a maximum emission wavelength of an irradiation light source is 1/2 or higher of a light absorption coefficient of the photopolymerization initiator is 0.5 to 8 mass % with respect to non-volatile components or a condition that a content of a polymerization inhibitor is 0.1 to 5 mass % with respect to the non-volatile components.

<2> The curable composition for imprinting according to claim 1, further comprising:

a solvent.

<3> The curable composition for imprinting according to <1> or <2>, in which a weight-average molecular weight of the polyfunctional polymerizable compound is 1,000 or higher.

<4> The curable composition for imprinting according to any one of <1> to <3>, in which the ultraviolet absorber includes any one of a benzophenone ultraviolet absorber, a benzotriazole ultraviolet absorber, or a cyanoacrylate ultraviolet absorber.

<5> The curable composition for imprinting according to any one of <1> to <4>, in which a ratio of the light absorption coefficient of the ultraviolet absorber to the light absorption coefficient of the photopolymerization initiator is 1/2 to 3/2.

<6> The curable composition for imprinting according to any one of <1> to <5>, further comprising:

a release agent.

<7> The curable composition for imprinting according to any one of <1> to <6>, in which a content of the polyfunctional polymerizable compound is 50 mass % or higher with respect to all polymerizable compounds.

<8> The curable composition for imprinting according to any one of <1> to <7>, in which a content of the photopolymerization initiator is 0.5 to 5 mass % with respect to the non-volatile components.

<9> The curable composition for imprinting according to any one of <1> to <8>, in which in a case where the curable composition for imprinting is applied to a silicon substrate at a thickness of 80 nm and is irradiated with light having a wavelength of 365 nm at an exposure dose of 10 mJ/cm$^2$ in an atmosphere having an oxygen concentration of 3%, a reaction rate of a polymerizable group is 50% or lower.

<10> The curable composition for imprinting according to any one of <1> to <9>, that is used for a step and repeat process.

<11> A method of manufacturing a cured product pattern using the curable composition for imprinting according to any one of <1> to <9>, the method comprising:

performing an imprinting method through a step and repeat process.

<12> The method of manufacturing a cured product pattern according to <11>, in which the curable composition for imprinting is applied to an adhesion layer.

<13> The method of manufacturing a cured product pattern according to <11> or <12>, in which the curable composition for imprinting is applied to a substrate using a spin coating method.

<14> A method of manufacturing a circuit substrate comprising:

the method of manufacturing a cured product pattern according to any one of <11> to <13>.

<15> A cured product which is formed of the curable composition for imprinting according to any one of <1> to <10>.

With the present invention, it is possible to provide a curable composition for imprinting capable of inhibiting an excessive reaction caused by light leak, a cured product, and a method of manufacturing a cured product pattern. In particular, it is also possible to provide a curable composition for imprinting that can be suitably used for a nanoimprinting process of a step and repeat process, a cured product, and a method of manufacturing a cured product pattern.

DESCRIPTION OF THE PREFERRED EMBODIMENTS

Figure 1A:
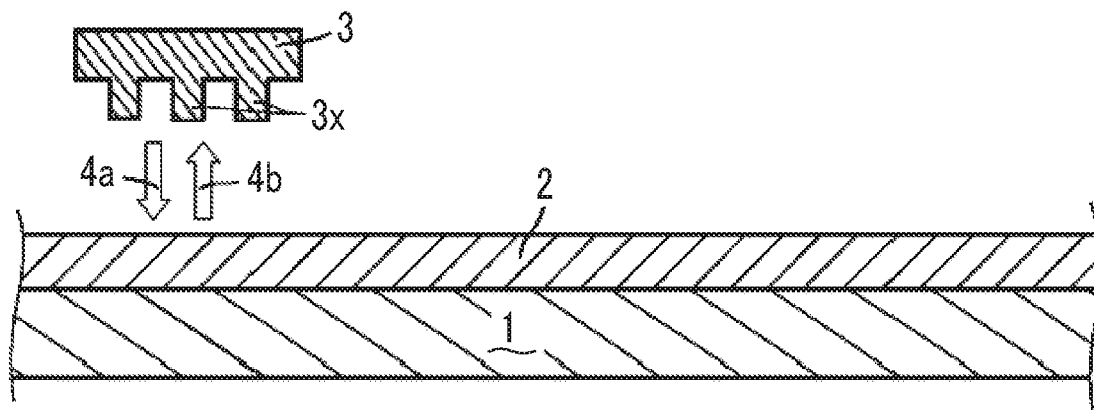
FIGS. 1A to 1C are cross-sectional views schematically showing steps of a nanoimprinting process of a step and repeat process.

Hereinafter, the details of the present invention will be described. In this specification, numerical ranges represented by "to" include numerical values before and after "to" as lower limit values and upper limit values.

In this specification, "(meth)acrylate" denotes acrylate and methacrylate, "(meth)acryl" denotes acryl and methacryl, and "(meth)acryloyl" denotes acryloyl and methacryloyl. "(meth)acryloyloxy" denotes acryloyloxy and methacryloyloxy.

In this specification, "imprint" denotes preferably transfer of a pattern having a size of 1 nm to 10 mm and more preferably transfer of a pattern having a size of about 10 nm to 100 μm (nanoimprint).

In this specification, unless specified as a substituted group or as an unsubstituted group, a group (atomic group) denotes not only a group having no substituent but also a group having a substituent. For example, "alkyl group" denotes not only an alkyl group having no substituent (unsubstituted alkyl group) but also an alkyl group having a substituent (substituted alkyl group).

In this specification, "light" refers to not only light in ultraviolet, near-ultraviolet, far-ultraviolet, visible, and infrared wavelength ranges and an electromagnetic wave but also radiation. Examples of the radiation include a microwave, an electron beam, extreme ultraviolet (EUV) radiation, and an X-ray. In addition, laser light such as 248 nm excimer laser light, 193 nm excimer laser light, or 172 nm excimer laser light can also be used. As these light components, monochromatic light (single-wavelength light) having passed through an optical filter may also be used, or light (complex light) having a plurality of different wavelengths may also be used.

Unless specified otherwise, various measurement and experiment temperatures in the present invention denote 23° C.

Unless specified otherwise, an atmospheric pressure during boiling point measurement in the present invention denotes 1013.25 hPa (1 atm).

In this specification, "step" denotes not only an individual step but also a step which is not clearly distinguishable from another step as long as an effect expected from the step can be achieved.

In this specification, unless specified otherwise, "weight-average molecular weight (Mw)" and "number-average molecular weight (Mn)" are defined as values in terms of polystyrene obtained by gel permeation chromatography (GPC). In this specification, the weight-average molecular weight (Mw) and the number-average molecular weight (Mn) can be obtained, for example, by using HLC-8220GPC (manufactured by Tosoh Corporation) and using a guard column HZ-L, TSK gel Super HZM-M, TSK gel Super HZ4000, TSK gel Super HZ3000, or TSK gel Super HZ2000 (manufactured by Tosoh Corporation) as a column. Unless specified otherwise, tetrahydrofuran (THF) is used as an eluent for measurement. In addition, unless specified otherwise, a detector that detects ultraviolet light (UV light) having a wavelength of 254 nm is used for detection.

A curable composition for imprinting according to an embodiment of the present invention satisfies the following A to C.

A: The curable composition comprises a polyfunctional polymerizable compound having a polymerizable group equivalent of 150 or higher.

B: The curable composition comprises a photopolymerization initiator.

C: The curable composition satisfies at least one of a condition that a content of an ultraviolet absorber in which a light absorption coefficient at a maximum emission wavelength of an irradiation light source is 1/2 or higher of a light absorption coefficient of the photopolymerization initiator is 0.5 to 8 mass % with respect to non-volatile components or a condition that a content of a polymerization inhibitor is 0.1 to 5 mass % with respect to the non-volatile components.

The non-volatile components refer to components in the curable composition for imprinting other than a solvent (a compound that is liquid at 23° C. and has a boiling point of 250° C. or lower).

With this configuration, a curable composition for imprinting capable of inhibiting an excessive reaction caused by light leak can be provided.

As a result, the reason why excessive reaction inhibiting properties are improved is presumed to be as follows. The reason will be described below with reference to the drawings using a nanoimprinting process of a step and repeat process as an example.

First, an example of the step and repeat process will be described.

Figure 1B:
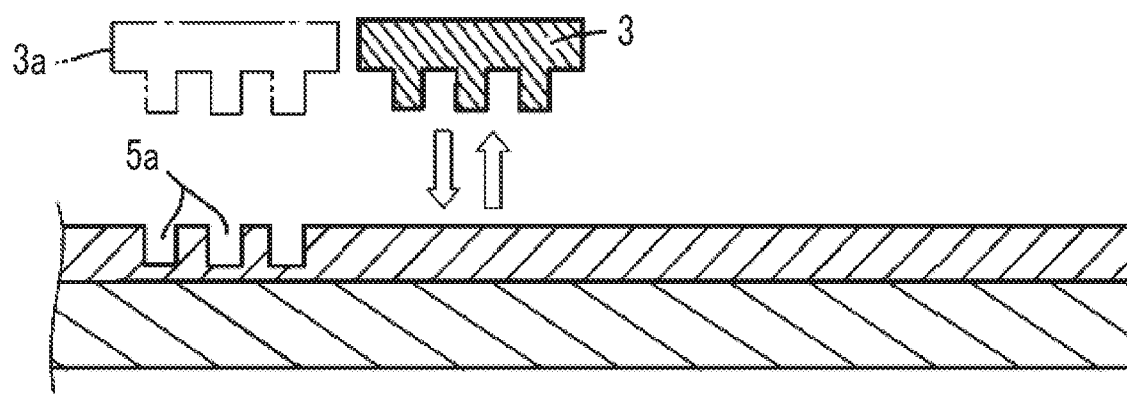
Figure 1C:
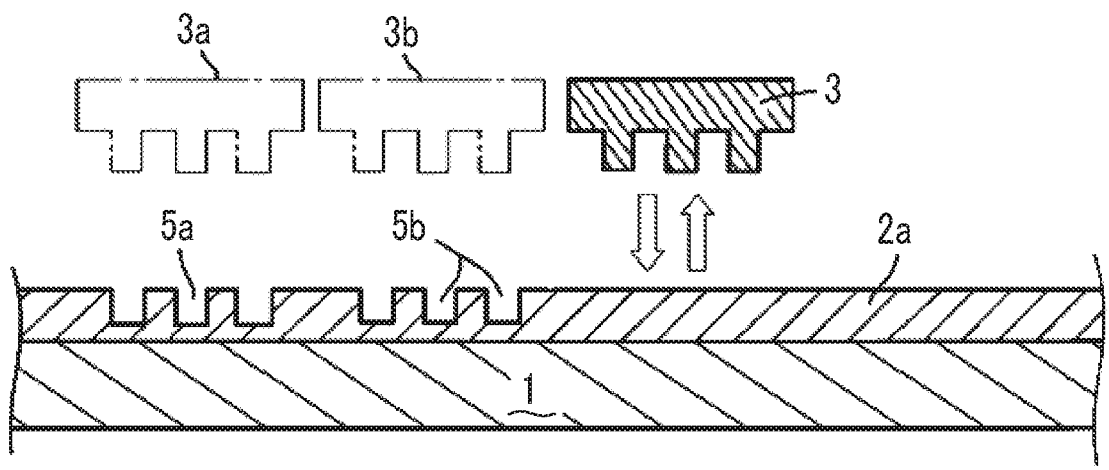

FIGS. 1A to 1C are cross-sectional views schematically showing steps of the nanoimprinting process of the step and repeat process. In the embodiment, a mold 3 is sequentially shifted in a plane direction of a substrate and then is imprinted (imprinting by press-contacting and mold releasing). In the embodiment shown in the drawing, the curable composition for imprinting is applied to a substrate 1 to form a layer (curable composition layer for imprinting) 2 (FIG. 1A). The mold 3 is fixed to a predetermined position and is pressed into contact 4a with the position. Next, the mold 3 is released 4b from the curable composition layer for imprinting. That is, a pattern (recess portion) 5a that is imprinted on the curable composition layer for imprinting in a shape corresponding to a protrusion portion 3x of the mold is formed (FIG. 1B). Although not shown in the drawing, in the embodiment, the curable composition for imprinting is exposed after being pressed into contact 4a with the mold. A light-transmitting material such as quartz is used as the mold, and the curable composition for imprinting that is imprinted through the mold is irradiated with light. The curable composition for imprinting is photocured and is cured by exposure. Next, the mold 3 is shifted from an original position 3a by a predetermined amount in a plane direction with respect to the substrate, and press-contacting 4a, exposing, and mold releasing 4b are performed as described above such that a recess portion 5b is formed on the curable composition layer for imprinting (FIG. 1C). Further, the mold is moved (from 3b to 3), and then press-contacting 4a, exposing, and mold releasing 4b are performed as described above. By repeating this operation, an imprinted layer 2a in which the desired pattern is widely formed on the substrate can be formed.

Figure 2:
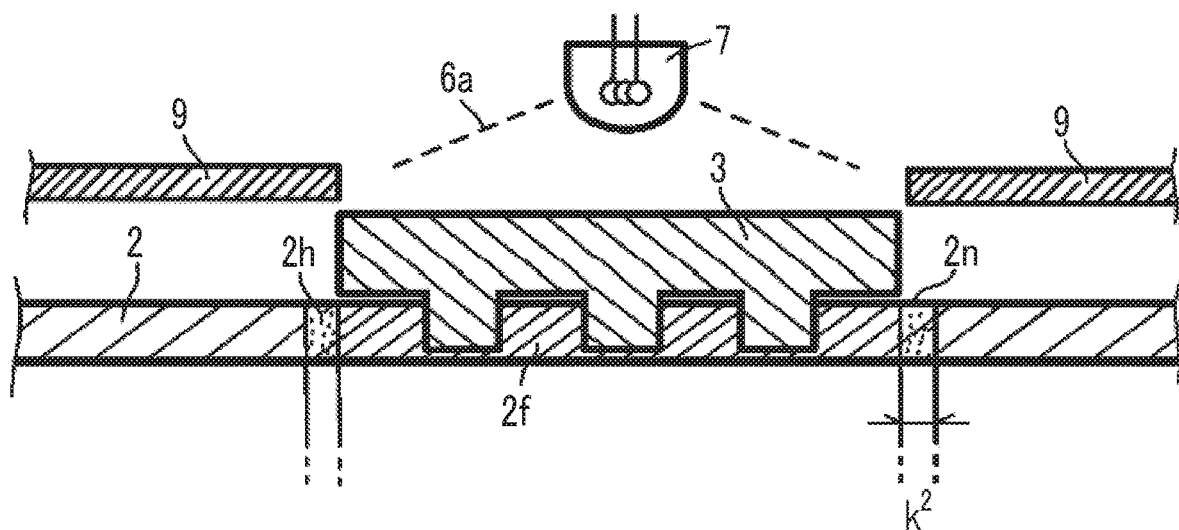
FIG. 2 is an enlarged cross-sectional view showing an example (Example according to the present invention) in which the curing of an adjacent portion caused by light leak during exposure is improved in the nanoimprinting process.

FIG. 2 is a cross-sectional view schematically showing the curing of an adjacent portion caused by light leak during exposure in the nanoimprinting process. FIG. 2 is an enlarged cross-sectional view of FIG. 1. As described above, in the nanoimprinting process according to the embodiment, after pressing the mold 3 into contact with the curable composition layer for imprinting, the curable composition layer for imprinting is exposed through the mold. As shown in FIG. 2, light 6 is emitted from a light source 7. This light 6 transmits through the mold 3 and reaches the curable composition for imprinting immediately below the mold such that the imprinted portion is cured (imprinted curing portion 2f). At this time, a shutter 9 is provided in order to prevent the curing of the curable composition 2 for imprinting in an adjacent portion 2n adjacent to the mold. However, the light 6 has typically diffusibility. Therefore, it is difficult to completely block the light 6, and the curing of the curable composition for imprinting in the adjacent portion 2n progresses. In order to deal with this problem, for example, the exposure dose may be reduced. As a result, the curable composition for imprinting of the exposed portion cannot be sufficiently patterned without being sufficiently cured.

In a preferred embodiment of the present invention, in a component composition of the curable composition for imprinting, a combination in which the progress of an excessive reaction in the adjacent portion caused by light leak is inhibited is adopted. Therefore, the adjacent portion 2n is not likely to be cured.

That is, in the present invention, by combining a polymerizable compound having a high polymerizable group equivalent and at least one of an ultraviolet absorber and a polymerization inhibitor, the curing of a peripheral portion of an exposed portion can be effectively inhibited, and a composition in which an exposed portion has a high reaction rate for sufficient curing can be obtained.

In the example of FIGS. 1A to 2, the action of the present invention has been described using the preferred embodiment. However, the present invention is not intended to be limited to the example. For example, in a nanoimprinting process of the related art, desired processing may be performed on an adjacent portion after mold processing. In this case, the wide and excessive curing of the adjacent portion in the preferred embodiment of the present invention can be prevented, which contributes to processing of a satisfactory imprinted layer.

<Polyfunctional Polymerizable Compound>

The curable composition for imprinting used in the present invention comprises a polyfunctional polymerizable compound having a polymerizable group equivalent of 150 or higher. By using this compound, the progress of curing can be inhibited. The polymerizable group equivalent is preferably 160 or higher, more preferably 190 or higher, and still more preferably 240 or higher. In addition, the polymerizable group equivalent is preferably 2,500 or lower, more preferably 1,800 or lower, and still more preferably 1,000 or lower. The polymerizable group equivalent is calculated from the following Expression 1.

(Polymerizable Group Equivalent)=(Average Molecular Weight of Polymerizable Compound)/(Number of Polymerizable Groups in Polyfunctional Polymerizable Compound)  Expression 1

In a case where the polymerizable group equivalent is excessively low, the concentration of the polymerizable group in the curable composition for imprinting is significantly high. Therefore, the reaction probability increases, and it is difficult to inhibit a reaction during irradiation at a low exposure dose. In addition, in a case where the polymerizable group equivalent is excessively high, the crosslinking density of the cured product pattern decreases significantly, and the resolution ability of a transfer pattern deteriorates.

The number of polymerizable groups in one molecule of the polyfunctional polymerizable compound is, for example, 2 to 20, preferably 2 to 15, and more preferably 2 to 12 and may be 2 to 7 or 2 or 3.

The kind of the polyfunctional polymerizable compound is not particularly limited within a range not departing from the scope of the present invention.

The molecular weight of the polyfunctional polymerizable compound is preferably 300 or higher, more preferably 400 or higher, still more preferably 500 or higher, and still more preferably 1000 or higher. The upper limit of the molecular weight is not particularly limited and, for example, is preferably 10,000 or lower, more preferably 5,000 or lower, and still more preferably 3,000 or lower. By adjusting the molecular weight to be the above-described lower limit value or higher, volatility can be more effectively suppressed, a high viscosity for maintaining a coating film can also be secured, and thus the stability of the coating film can be improved, which is preferable. By adjusting the molecular weight to be the above-described upper limit value or lower, a viscosity required for pattern filling is likely to be secured, which is preferable.

The molecular weight of the polyfunctional polymerizable compound may be measured using an appropriate measurement method. In a case where the molecular weight is lower than 1000, the molecular weight is identified by mass spectrometry. In a case where the molecular weight is 1000 or higher, a weight-average molecular weight measured by gel permeation chromatography (GPC) is adopted. Measurement conditions of GPC are as described above. In a case where a compound is not soluble in a carrier, a carrier in which the compound is appropriately soluble can be selected. For example, the detailed measurement procedure is defined by JIS K7252-1 to 5:2016 (size-exclusion chromatography: SEC).

The viscosity of the polyfunctional polymerizable compound at 23° C. is preferably 120 mPa·s or higher and more preferably 150 mPa·s or higher. The upper limit value of the above-described viscosity is preferably 2000 mPa·s or lower, more preferably 1500 mPa·s or lower, and still more preferably 1200 mPa·s or lower.

The kind of the polymerizable group included in the polyfunctional polymerizable compound is not particularly limited, and examples of the polymerizable group include an ethylenically unsaturated group and an epoxy group. Among these, an ethylenically unsaturated group is preferable. Examples of the ethylenically unsaturated group include a group having a (meth)acryloyl group, a vinyl group, an allyl group, a vinylphenyl group, or the like. Among these, a group having a (meth)acryloyl group is more preferable, and a group having an acryloyl group is still more preferable. It is preferable that the group having a (meth)acryloyl group is a (meth)acryloyloxy group. The above-described examples of the polymerizable group will be referred to as "polymerizable group E" in this specification.

In a case where the curable composition for imprinting is used as an etching resist, it is preferable that the polyfunctional polymerizable compound includes a ring structure (in particular, an aromatic ring structure) or a silicon atom (Si).

Examples of the ring structure include an aromatic ring, an aromatic heterocycle, and an alicyclic ring.

The number of carbon atoms in the aromatic ring is preferably 6 to 22, more preferably 6 to 18, and still more preferably 6 to 10. Specific examples of the aromatic ring include a benzene ring, a naphthalene ring, an anthracene ring, a phenanthrene ring, a phenalene ring, a fluorene ring, a benzocyclooctene ring, an acenaphthylene ring, a biphenylene ring, an indene ring, an indane ring, a triphenylene ring, a pyrene ring, a chrysene ring, a perylene ring, and a tetrahydronaphthalene ring (hereinafter, the examples of the aromatic ring will be referred to as "aromatic ring aCy"). Among these, a benzene ring or a naphthalene ring is preferable, and a benzene ring is more preferable. The aromatic ring may have a structure in which a plurality of rings are linked to each other, and examples thereof include a biphenyl ring and a bisphenyl ring.

The number of carbon atoms in the aromatic heterocycle is preferably 1 to 12, more preferably 1 to 6, and still more preferably 1 to 5. Specific examples of the aromatic heterocycle include a thiophene ring, a furan ring, a pyrrole ring, an imidazole ring, a pyrazole ring, a triazole ring, a tetrazole ring, a thiazole ring, a thiadiazole ring, an oxadiazole ring, an oxazole ring, a pyridine ring, a pyrazine ring, a pyrimidine ring, a pyridazine ring, an isoindole ring, an indole ring, an indazole ring, a purine ring, a quinolizine ring, an isoquinoline ring, a quinoline ring, a phthalazine ring, a naphthyridine ring, a quinoxaline ring, a quinazoline ring, a cinnoline ring, a carbazole ring, an acridine ring, a phenazine ring, a phenothiazine ring, a phenoxathiin ring, and a phenoxazine ring (the above-described examples will be referred to as "ring hCy").

The number of carbon atoms in the alicyclic ring is preferably 3 or more, more preferably 4 or more, and still more preferably 6 or more. In addition, the number of carbon atoms is preferably 22 or less, more preferably 18 or less, still more preferably 6 or less, and still more preferably 5 or less. Specific examples of the alicyclic ring include a cyclopropane ring, a cyclobutane ring, a cyclobutene ring, a cyclopentane ring, a cyclohexane ring, a cyclohexene ring, a cycloheptane ring, a cyclooctane ring, a dicyclopentadiene ring, a spirodecane ring, a spirononane ring, a tetrahydrodicyclopentadiene ring, an octahydronaphthalene ring, a decahydronaphthalene ring, a hexahydroindane ring, a bornane ring, a norbomane ring, a norbornene ring, a isobornane ring, a tricyclodecane ring, a tetracyclododecane ring, an adamantane ring, and (the above-described examples will be referred to as "ring fCy"). The rings aCy, hCy, and fCy will be collectively referred to as "ring Cz".

It is preferable that the polyfunctional polymerizable compound is a compound represented by the following Formula (1) or (2).

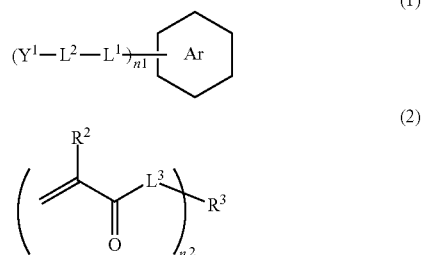

In Formula (1), Ar represents an aromatic ring (having preferably 6 to 22 carbon atoms, more preferably 6 to 18 carbon atoms, and still more preferably 6 to 10 carbon atoms), a structure in which a plurality of aromatic rings are linked to each other, an aromatic heterocycle (having preferably 1 to 12 carbon atoms, more preferably 1 to 6 carbon atoms, and still more preferably 1 to 5 carbon atoms), a structure in which an aromatic ring and an aromatic heterocycle are linked to each other, a structure in which a plurality of aromatic heterocycles are linked to each other, an alicyclic ring (having preferably 3 or more carbon atoms, more preferably 4 or more carbon atom, and still more preferably 6 or more carbon atoms and having preferably 22 or less carbon atoms, more preferably 18 or less carbon atoms, still more preferably 6 or less carbon atoms, and still more preferably 5 or less carbon atoms), a structure in which an alicyclic ring and an aromatic ring are linked to each other, a structure in which an alicyclic ring and an aromatic heterocycle are linked to each other, or a structure in which a plurality of alicyclic rings are linked to each other. The respective rings may be linked to each other through a linking group L described below. Specific examples of the aromatic ring include the examples of the aromatic ring aCy. Examples of the aromatic heterocycle include the examples of the hCy. Examples of the alicyclic ring include the examples of the fCy. Ar may have the following substituent T within a range where the effects of the present invention are exhibited. A plurality of substituents T may be bonded through or without the linking group L to form a ring. In addition, Ar or the substituent T may be bonded to a linking group $L^1$ or $L^2$ through or without the linking group L to form a ring. Examples of the linking groups $L^1$ and $L^2$ include examples of the linking group L described below. In particular, it is preferable that $L^1$ and $L^2$ each independently represent an alkylene group (having preferably 1 to 12 carbon atoms, more preferably 1 to 6 carbon atoms, and still more preferably 1 to 3 carbon atoms), an alkenylene group, a heterocyclic linking group hL (a linking group selected from —O—, —S—, —SO$_2$—, —CO—, or —NR$^N$—), or a combination thereof. In particular, it is preferable that $L^1$ represents a heterocyclic linking group hL (preferably —O—) and $L^2$ represents a (poly)alkyleneoxy group (the number of carbon atoms in the alkylene group is preferably 1 to 12, more preferably 1 to 6, and still more preferably 1 to 3; and the number of repeating units is preferably 1 to 20, more preferably 1 to 16, and still more preferably 1 to 12). The alkylene group in the alkyleneoxy group may have the substituent T. For example, an aspect in which the alkylene group has a hydroxyl group can be adopted as a preferable aspect. $Y^1$ represents a polymerizable group, and examples thereof include the examples of the above-described polymerizable group E. Among these, a (meth)acryloyl group is preferable. n1 represents an integer of 2 to 6, preferably an integer of 2 to 4, and more preferably 2 or 3. In this specification, the (poly)alkyleneoxy group) is a collective term for an alkyleneoxy group and a polyalkyleneoxy group.

Examples of the aromatic ring, the aromatic heterocycle, and/or the structure in which a plurality of alicyclic rings are linked to each other include the following Formula AR-1 or AR-2.

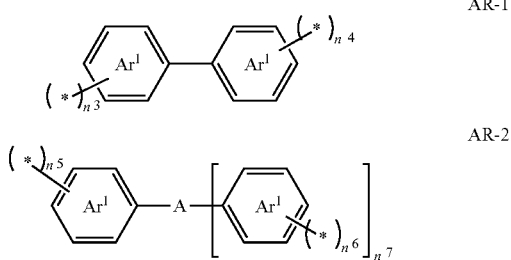

In the formulae, $Ar^1$ represents an aromatic ring, an aromatic heterocycle, or an alicyclic ring, and preferable examples thereof include the aromatic ring aCy, the aromatic heterocycle hCy, and the alicyclic ring fCy. A represents a 1+n7-valent linking group. n7 represents an integer of 1 to 5, preferably an integer of 1 to 4, more preferably an integer of 1 to 3, and still more preferably 1 or 2. Examples of the divalent linking group include the examples of the linking group L. In particular, —C(CH$_3$)$_2$— which may be substituted with —CH$_2$—, —O—, —S—, —SO$_2$—, or a halogen atom (in particular, a fluorine atom) or an alkylene group (preferably a methylene group, an ethylene group, or a propylene group) having a substituted fluorene group at the 9-position is preferable. Examples of the trivalent or higher linking group include a group having an alkane structure (having preferably 1 to 12 carbon atoms, more preferably 1 to 6 carbon atoms, and still more preferably 1 to 3 carbon atoms), a group having an alkene structure (preferably having 3 to 12 carbon atoms and more preferably having 3 to 6 carbon atoms), and a group having an alkyne structure (preferably having 3 to 12 carbon atoms and more preferably having 3 to 6 carbon atoms). The aromatic ring represented by $Ar^1$ or the linking group represented by A may have the substituent T. In a case where a plurality of substituents T are present, the substituents T may be bonded to each other or may be bonded to the ring $Ar^1$ in the formula through or without the linking group L to form a ring. In addition, the substituent T may be bonded to the linking group A or to the linking group $L^1$ or $L^2$ through or without the linking group L to form a ring. * represents a binding site to $L^1$. n3 to n6 each independently represent an integer of 1 to 3, preferably 1 or 2, and more preferably 1. In this case, n5+n6×n7 does not exceed 6 that is the maximum value of n1.

In Formula (2), $R^2$ represents a hydrogen atom or a methyl group. $L^3$ represents the linking group L and preferably the heterocyclic linking group ht, (in particular, an oxygen atom). n2 represents an integer of 2 to 6, preferably an integer of 2 to 4, and more preferably 2 or 3. $R^3$ represents an n2-valent group and preferably a group having a linear or branched alkane structure (having preferably 1 to 30 carbon atoms, more preferably 2 to 20 carbon atoms, and still more preferably 2 to 15 carbon atoms), a group having a linear or branched alkene structure (having preferably 2 to 30 carbon atoms, more preferably 2 to 20 carbon atoms, and still more preferably 2 to 15 carbon atoms), or a group having a linear or branched alkyne structure (having preferably 2 to 30 carbon atoms, more preferably 2 to 20 carbon atoms, and still more preferably 2 to 15 carbon atoms). $R^3$ may have the heterocyclic linking group hL (for example, an oxygen atom) at a terminal or an intermediate position. It is preferable that the number of heterocyclic linking groups hL is one with respect to 1 to 6 carbon atoms. $R^3$ may have the substituent T. In a case where a plurality of substituents T are present, the substituents T may be bonded to each other or may be bonded to $R^3$ in the formula through or without the linking group L to form a ring.

Examples of the linking group L include a linear or branched alkylene group (having preferably 1 to 24 carbon atoms, more preferably 1 to 12 carbon atoms, and still more preferably 1 to 6 carbon atoms), a linear or branched alkenylene group (having preferably 2 to 12 carbon atoms, more preferably 2 to 6 carbon atoms, and still more preferably 2 or 3 carbon atoms), a linear or branched alkynylene group (having preferably 2 to 12 carbon atoms, more preferably 2 to 6 carbon atoms, and still more preferably 2 or 3 carbon atoms), an arylene group (having preferably 6 to 22 carbon atoms, more preferably 6 to 18 carbon atoms, and still more preferably 6 to 10 carbon atoms), —O—, —S—, —SO$_2$—, —CO—, —NR$^N$—, and a linking group relating to a combination thereof. $R^N$ represents a hydrogen atom or an alkyl group (preferably an alkyl group having 1 to 12 carbon atoms, more preferably an alkyl group having 1 to 6 carbon atoms, still more preferably an alkyl group having 1 to 3 carbon atoms, and still more preferably a methyl group). The alkylene group, the alkenylene group, and the alkynylene group may have the following substituent T. For example, the alkylene group may be a fluorinated alkylene group having a fluorine atom. The number of atoms included in the linking group L is preferably 1 to 24, more preferably 1 to 12, and still more preferably 1 to 6.

The substituent T include an alkyl group (having preferably 1 to 24 carbon atoms, more preferably 1 to 12 carbon atoms, and still more preferably 1 to 6 carbon atoms), a cycloalkyl group (having preferably 3 to 24 carbon atoms, more preferably 3 to 12 carbon atoms, and still more preferably 3 to 6 carbon atoms), an aralkyl group (having preferably 7 to 21 carbon atoms, more preferably 7 to 15 carbon atoms, and still more preferably 7 to 11 carbon atoms), an alkenyl group (having preferably 2 to 24 carbon atoms, more preferably 2 to 12 carbon atoms, and still more preferably 2 to 6 carbon atoms), a cycloalkenyl group (having preferably 3 to 24 carbon atoms, more preferably 3 to 12 carbon atoms, and still more preferably 3 to 6 carbon atoms), a hydroxyl group, an amino group (having preferably 0 to 24 carbon atoms, more preferably 0 to 12 carbon atoms, and still more preferably 0 to 6 carbon atoms), a thiol group, a carboxyl group, an aryl group (having preferably 6 to 22 carbon atoms, more preferably 6 to 18 carbon atoms, and still more preferably 6 to 10 carbon atoms), an acyl group (having preferably 2 to 12 carbon atoms, more preferably 2 to 6 carbon atoms, and still more preferably 2 or 3 carbon atoms), an acyloxy group (having preferably 2 to 12 carbon atoms, more preferably 2 to 6 carbon atoms, and still more preferably 2 or 3 carbon atoms), an aryloyl group (having preferably 7 to 23 carbon atoms, more preferably 7 to 19 carbon atoms, and still more preferably 7 to 11 carbon atoms), an aryloyloxy group (having preferably 7 to 23 carbon atoms, more preferably 7 to 19 carbon atoms, and still more preferably 7 to 11 carbon atoms), a carbamoyl group (having preferably 1 to 12 carbon atoms, more preferably 1 to 6 carbon atoms, and still more preferably 1 to 3 carbon atoms), a sulfamoyl group (having preferably 0 to 12 carbon atoms, more preferably 0 to 6 carbon atoms, and still more preferably 0 to 3 carbon atoms), a sulfo group, an alkylsulfonyl group (having preferably 1 to 12 carbon atoms, more preferably 1 to 6 carbon atoms, and still more preferably 1 to 3 carbon atoms), an arylsulfonyl group (having preferably 6 to 22 carbon atoms, more preferably 6 to 18 carbon atoms, and still more preferably 6 to 10 carbon atoms), a heterocyclic group (having preferably 1 to 12 carbon atoms, more preferably 1 to 8 carbon atoms, and still more preferably 2 to 5 carbon atoms; having preferably a 5- or 6-membered ring), a (meth)acryloyl group, a (meth)acryloyloxy group, a halogen atom (for example, a fluorine atom, a chlorine atom, a bromine atom, or an iodine atom), an oxo group (=O), an imino group (=NR$^N$), and an alkylidene group (=C(R$^N$)$_2$). R$^N$ has the same definition as described above. The alkyl portion and the alkenyl portion included in each of the substituents may be linear or branched or may be chain-like or cyclic. In a case where the substituent T is a group which may have a substituent, the group may further have the substituent T. For example, the alkyl group may be an alkyl halide group, a (meth)acryloyloxyalkyl group, an aminoalkyl group, or a carboxyalkyl group. In a case where the substituent is a group that may form a salt such as a carboxyl group or an amino group, the group may form a salt.

It is preferable that the polyfunctional polymerizable compound is a silicone compound having at least one of a siloxane structure represented by the following Formula (S1) or a siloxane structure represented by the following Formula (S2).

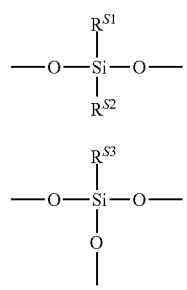

R$^{S1}$ to R$^{S3}$ represent a hydrogen atom or a monovalent substituent and preferably a substituent. Examples of the substituent include the examples of the substituent T. In particular, a cyclic or chain-like (linear or branched) alkyl group (having preferably 1 to 12 carbon atoms, more preferably 1 to 6 carbon atoms, and still more preferably 1 to 3 carbon atoms) or a group having a polymerizable group is preferable. The above-described silicone compound has two or more polymerizable groups. In particular, it is preferable that the silicone compound has two or more of the above-described polymerizable groups E. The number of polymerizable groups in the molecule is not particularly limited as long as the requirement of the polymerizable group equivalent according to the present invention is satisfied. For example, the number of polymerizable groups is preferably 2 to 20, more preferably 2 to 15, and still more preferably 2 to 12.

It is preferable that the above-described silicone compound is a compound represented by the following Formula (S3).

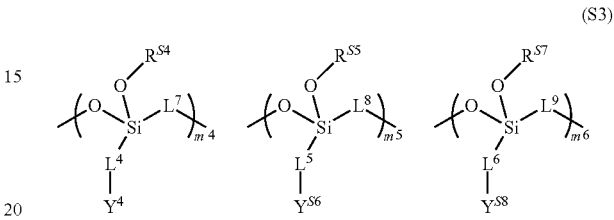

R$^{S4}$, R$^{S5}$, and R$^{S7}$ represent a hydrogen atom or an alkyl group (preferably an alkyl group having 1 to 12 carbon atoms, more preferably an alkyl group having 1 to 6 carbon atoms, and still more preferably an alkyl group having 1 to 3 carbon atoms). L$^4$ represents a linking group, preferably the examples of the linking group L, and more preferably an alkylene group (preferably having 1 to 12 carbon atoms, more preferably 1 to 6 carbon atoms, and still more preferably 1 to 3 carbon atoms). Y$^4$ represents a polymerizable group, preferably the examples of the polymerizable group E, and more preferably a (meth)acryloyloxy group. L$^5$ to L$^9$ each independently represent an oxygen atom or a single bond. R$^{S6}$ represents a group having a ring structure, preferably the examples of the aromatic ring aCy, the aromatic heterocycle hCy, and the alicyclic ring fCy, and more preferably the examples of the aromatic ring aCy. R$^{S8}$ represents a linear or branched alkyl group (having preferably 1 to 12 carbon atoms, more preferably 1 to 6 carbon atoms, and still more preferably 1 to 3 carbon atoms), a linear or branched alkenyl group (having preferably 2 to 12 carbon atoms, more preferably 2 to 6 carbon atoms, and still more preferably 2 or 3 carbon atoms), or a linear or branched alkynyl group (having preferably 2 to 12 carbon atoms, more preferably 2 to 6 carbon atoms, and still more preferably 2 or 3 carbon atoms). In particular, an alkyl group is preferable. m4, m5, and m6 represent a mass ratio, and the sum thereof is 100 parts. m4 represents preferably 20 to 95 parts by mass and more preferably 30 to 90 parts by mass. m5 represents preferably 0 to 40 parts by mass and more preferably 0 to 30 parts by mass. m6 represents preferably 5 to 50 parts by mass and more preferably 10 to 40 parts by mass. L$^4$ and R$^{S4}$ to R$^{S8}$ may have the substituent T. In a case where a plurality of substituents T are present, the substituents T may be bonded to each other or may be bonded to L$^4$ or R$^{S4}$ to R$^{S8}$ in the formula through or without the linking group L to form a ring.

Specific examples of the polyfunctional polymerizable compound include compounds used in Examples described below and the following compounds. However, the present invention is not intended to be limited to these examples.

TABLE 1

| Compound | Molecular Weight | Number of Polymerizable Groups | Polymerizable Group Equivalent | Trade Name |
|---|---|---|---|---|
| (structure) | 480 | 3 | 160 | DAICEL-ALLNEX LTD. Ebecryl OTA 480 |
| UV-Curable Silicone Acrylic Polymer | 8450 | 25 | 338 | Taisei Fine Chemical Co., Ltd. 8SS |
| (structure with fluorene) | 544 | 2 | 272 | Osaka Gas Chemicals Co., Ltd. OGSOL EA-0200 |
| (structure) m + n = 20 | 1216 | 2 | 608 | Shin Nakamura Chemical Co., Ltd. NK ester A-BPE-20 |
| (structure) m + n = 10 | 776 | 2 | 388 | Shin Nakamura Chemical Co., Ltd. NK ester A-BPE-10 |
| (structure) m + n = 4 | 512 | 2 | 256 | NK ester A-BPE4 |
| (siloxane structure) | 1190 | 6 | 198 | |

TABLE 1-continued

| Compound | Molecular Weight | Number of Polymerizable Groups | Polymerizable Group Equivalent | Trade Name |
|---|---|---|---|---|
| 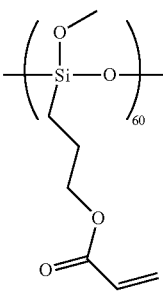 | 2300 | 12 | 192 | |
| 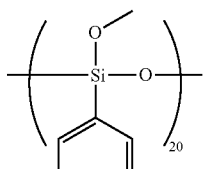 | 938 | 4 | 235 | |

Lower right numerical values of ( ) added to the silicone compound represent a molar ratio with respect to 100 parts of the total mass.

In the case of a polymer, the molecular weight represents a weight-average molecular weight.

Examples of the polyfunctional polymerizable compound include compounds described in paragraphs "0025" to "0035" of JP2014-170949A and paragraphs "0019" to "0028" of JP2013-189537A, the contents of which are incorporated herein by reference. Among these exemplary compounds, a compound satisfying the above-described condition A can be adopted as the curable composition for imprinting according to the embodiment of the present invention.

The content of the polyfunctional polymerizable compound in the curable composition for imprinting is preferably 50 mass % or higher, more preferably 65 mass % or higher, and still more preferably 80 mass % or higher with respect to all the polymerizable compounds. By adjusting the content to be the above-described lower limit value or higher, sufficient film stability can be applied to the coating film of the curable composition for imprinting, which is preferable. In addition, the curable composition for imprinting can be made to have an appropriate polymerizable group concentration. As a result, the reactivity at a low exposure dose can be more effectively inhibited while maintaining pattern resolution ability. The upper limit value is not particularly limited and may be 100 mass %.

The content of the polyfunctional polymerizable compound is preferably 60 mass % or higher, more preferably 70 mass % or higher, still more preferably 80 mass % or higher, and still more preferably 90 mass % or higher with respect to the non-volatile components of the curable composition for imprinting. The upper limit is substantially 99.99 mass % or lower.

One polyfunctional polymerizable compound may be used, or a plurality of polyfunctional polymerizable compounds may be used. In a case where a plurality of polyfunctional polymerizable compounds are used, it is preferable that the total content of the polyfunctional polymerizable compounds is in the above-described range.

<Photopolymerization Initiator>

As the photopolymerization initiator, a radical polymerization initiator or a cationic polymerization initiator is preferable, and a radical polymerization initiator is more preferable.

As the photoradical polymerization initiator, any well-known compound can be used. Examples of the photopolymerization initiator include a halogenated hydrocarbon derivative (for example, a compound having a triazine skeleton, a compound having an oxadiazole skeleton, or a compound having a trihalomethyl group), an acylphosphine compound such as acylphosphine oxide, hexaarylbiimidazole, an oxime compound such as an oxime derivative, an organic peroxide, a thio compound, a ketone compound, an aromatic onium salt, keto oxime ether, an aminoacetophenone compound, hydroxyacetophenone, an azo compound, an azide compound, a metallocene compound, an organic boron compound, and an iron arene complex. The details of the other components can be found in paragraphs "0165" to "0182" of JP2016-027357A, the content of which is incorporated herein by reference.

Examples of the acylphosphine compound include 2,4,6-trimethylbenzoyl-diphenyl-phosphine oxide. In addition, IRGACURE-819, or IRGACURE-TPO (trade name, all of which are manufactured by BASF SE) which is a commercially available product can be used.

The light absorption coefficient of the polymerization initiator at a wavelength of 313 nm is preferably 10,000 mL/g·cm or higher, more preferably 12,000 mL/g·cm or higher, and still more preferably 15,000 mL/g·cm or higher.

The light absorption coefficient of the polymerization initiator at a wavelength of 313 nm is not particularly limited and, for example, is preferably 50,000 mL/g·cm or lower.

The light absorption coefficient of the polymerization initiator at a wavelength of 365 nm is preferably 100 mL/g·cm or higher, more preferably 1,000 mL/g·cm or higher, and still more preferably 2,000 mL/g·cm or higher. The light absorption coefficient of the polymerization initiator at a wavelength of 365 nm is not particularly limited and, for example, is preferably 30,000 mL/g·cm or lower.

In a case where two or more polymerization initiators are included, it is preferable that the content of a polymerization initiator satisfying the above-described range is 50 mass % or higher with respect to the total mass of the mixed polymerization initiators.

The content of the photopolymerization initiator is preferably 10 mass % or lower, more preferably 5 mass % or lower, and still more preferably 4 mass % or lower with respect to the non-volatile components of the curable composition for imprinting. In addition, the content of the photopolymerization initiator is preferably 0.2 mass % or higher, more preferably 0.5 mass % or higher, and still more preferably 1 mass % or higher. In a case where the content is excessively high, an excess amount of an active material is produced even during exposure at a low irradiation dose, and it is difficult to control the reactivity. In addition, in a case where the content is excessively low, it is difficult to produce a sufficient amount of an active material for a reaction of the polymerizable compound, which leads to deterioration in resolution ability. One photopolymerization initiator may be used, or a plurality of photopolymerization initiators may be used. In a case where a plurality of photopolymerization initiators are used, it is preferable that the total content of the photopolymerization initiators is in the above-described range.

<Ultraviolet Absorber and Polymerization Inhibitor>

The curable composition for imprinting according to the embodiment of the present invention comprises a predetermined ultraviolet absorber and at least one polymerization inhibitor. By mixing the ultraviolet absorber, absorption of light by a peripheral portion that is not irradiated with light can be effectively inhibited. By mixing 0.1 parts by mass or more of the polymerization inhibitor, the progress of the curing of the polymerizable compound can be inhibited.

<<Ultraviolet Absorber>>

In the ultraviolet absorber used in the present invention, a light absorption coefficient at a maximum emission wavelength of an irradiation light (light with which the curable composition for imprinting is irradiated) present in a photosensitive wavelength region of the photopolymerization initiator is 1/2 or higher of a light absorption coefficient of the photopolymerization initiator. However, in a case where three or more maximum emission wavelengths are present in the photosensitive wavelength region of the photopolymerization initiator, maximum emission wavelengths having two highest relative intensities only have to satisfy the above-described condition. For example, in the case of a high-pressure mercury lamp that is a general light source used for ultraviolet curing, 365 nm and 313 nm having two highest relative intensities among four maximum emission wavelengths (305 nm, 313 nm, 340 nm, and 365 nm) in 300 nm to 400 nm (a photosensitive wavelength region of a general photopolymerization initiator) only have to satisfy the above-described condition.

The light absorption coefficient of the ultraviolet absorber at a wavelength of 313 nm is preferably 5,000 mL/g·cm or higher, more preferably 6,500 mL/g·cm or higher, and still more preferably 8,000 mL/g·cm or higher. The light absorption coefficient of the ultraviolet absorber at a wavelength of 313 nm is preferably 50,000 mL/g·cm or lower and more preferably 40,000 mL/g·cm or lower.

The light absorption coefficient of the ultraviolet absorber at a wavelength of 365 nm is preferably 1,000 mL/g·cm or higher and more preferably 5,000 mL/g·cm or higher. The light absorption coefficient of the ultraviolet absorber at a wavelength of 365 nm is preferably 60,000 mL/g·cm or lower.

In a case where two or more ultraviolet absorbers are included, it is preferable that the content of an ultraviolet absorber satisfying the above-described range is 50 mass % or higher with respect to the total mass of the mixed ultraviolet absorbers.

In a case where light (flare light) that leaks during exposure is absorbed, the ultraviolet absorber inhibits reaction light from reaching the photopolymerization initiator and functions to inhibit the reactivity of the curable composition for imprinting at a low exposure dose.

Examples of the ultraviolet absorber include a benzotriazole, a triazine, a cyan acrylate, a benzophenone, and a benzoate. Among these, from the viewpoint of compatibility with the polymerizable compound and the absorption wavelength, a benzophenone, a benzotriazole, or a cyan acrylate is preferable.

It is more preferable that the ultraviolet absorber has a hydrocarbon chain having 4 or more (preferably 6 to 24 and more preferably 6 to 14) carbon atoms. As the hydrocarbon chain, an alkyl chain, an alkylene chain, or a fluoroalkyl chain is preferable. In the present invention, in particular, it is preferable that a benzophenone ultraviolet absorber has a hydrocarbon chain.

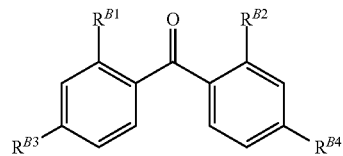

(B-1)

It is preferable that $R^{B1}$ and $R^{B2}$ each independently represent a hydrogen atom or a hydroxyl group. It is preferable that $R^{B3}$ and $R^{B4}$ each independently represent a hydrogen atom, a hydroxyl group, an alkoxy group (having preferably 1 to 24 carbon atoms, more preferably 1 to 16 carbon atoms, and still more preferably 1 to 10 carbon atoms), an aryloxy group (having preferably 6 to 22 carbon atoms, more preferably 6 to 18 carbon atoms, and still more preferably 6 to 10 carbon atoms), an aralkyloxy group (having preferably 7 to 23 carbon atoms, more preferably 7 to 19 carbon atoms, and still more preferably 7 to 11 carbon atoms), or a group having an alicyclic structure (having preferably 3 to 24 carbon atoms, more preferably 3 to 12 carbon atoms, and still more preferably 3 to 6 carbon atoms). In the formula, the benzene ring, $R^{B3}$, and $R^{B4}$ may have the substituent T. In a case where a plurality of substituents T are present, the substituents T may be bonded to each other or may be bonded to the benzene ring, $R^{B3}$, or $R^{B4}$ in the formula through or without the linking group L to form a ring. It is preferable that at least one of $R^{B3}$ or $R^{B4}$ represents a group which has a hydrocarbon chain having 4 or more carbon atoms.

It is preferable that an absorption peak wavelength of the ultraviolet absorber is present in a photosensitive wavelength range of a general photopolymerization initiator. For example, the absorption peak wavelength is present preferably in 250 to 440 nm and more preferably in 280 to 400 nm.

The content of the ultraviolet absorber is 0.5 to 8 mass %, preferably 0.7 to 7 mass %, and more preferably 1.0 to 5 mass % with respect to the non-volatile components of the curable composition for imprinting. In a case where the content is excessively low, it is difficult to inhibit the reactivity of the photopolymerization initiator. In addition, conversely, in a case where the content is excessively high, there is an adverse effect on the performance of the curable composition for imprinting, for example, collapse of a transfer pattern. One ultraviolet absorber may be used, or a plurality of ultraviolet absorbers may be used. In a case where a plurality of ultraviolet absorbers are used, it is preferable that the total content of the ultraviolet absorbers is in the above-described range.

In a case where a film is formed using the curable composition for imprinting, it is preferable that the ultraviolet absorber has surface segregation properties. By being segregated on the surface, the ultraviolet absorber can effectively inhibit transmission of leakage light into the film. Therefore, it is preferable that the ultraviolet absorber has a hydrophobic substituent Hp. Specific examples of the hydrophobic substituent Hp include [2-hydroxy-4-(octyloxy)phenyl](phenyl)methanone.

Specific examples of the ultraviolet absorber include ADEKA STAB LA-24, LA-36, LA-46, and LA-F70 (trade names; manufactured by Adeka Corporation), Sumisorb 130, Sumisorb 200, Sumisorb 300, and Sumisorb 400 (trade names; manufactured by Sumika Chemtex Co., Ltd.), and Uvinul 3030, 3035, 3039, 3049, and 3050 (trade names; manufactured by BASF SE).

In the ultraviolet absorber used in the present invention, the light absorption coefficient at a maximum emission wavelength of an irradiation light source is 1/2 or higher of the light absorption coefficient of the photopolymerization initiator. A ratio between the light absorption coefficients is preferably 1/2 or higher and more preferably 4/5 or higher. The upper limit is preferably 8 or lower, more preferably 5 or lower, and still more preferably 3/2 or lower. Within the above-described range, the reactivity at a low irradiation dose can be effectively inhibited without deterioration in reactivity during curing. The maximum emission wavelength of the irradiation light source is not particularly limited and, in consideration of a usual exposure light source of the nanoimprinting process, is typically in a wavelength range of 250 to 500 nm, more typically in a wavelength range of 280 to 450 nm, and still more typically in a wavelength range of 300 to 400 nm. Within the above-described range, a general photopolymerization initiator can be made to function effectively.

The light absorption coefficient of a compound refers to a value measured using a method described in Examples below.

<<Polymerization Inhibitor>>

The polymerization inhibitor has a function of quenching (deactivating) an active material such as a radical generated from the photopolymerization initiator and functions to inhibit the reactivity of the curable composition for imprinting at a low exposure dose. The content of the polymerization inhibitor is 0.1 to 5 mass % and preferably 0.5 to 3 mass %. In a case where the content is excessively low, it is difficult to inhibit the reactivity of the photopolymerization initiator. In addition, conversely, in a case where the content is excessively high, there is an adverse effect on the performance of the curable composition for imprinting, for example, collapse of a transfer pattern.

A mixing ratio between the ultraviolet absorber and the polymerization inhibitor may be appropriately adjusted. The amount of the polymerization inhibitor is preferably 5 parts by mass or more, more preferably 10 parts by mass or more, and still more preferably 30 parts by mass or more with respect to 100 parts by mass of the ultraviolet absorber. The upper limit value is preferably 1000 parts by mass or less, more preferably 800 parts by mass or less, and still more preferably 500 parts by mass or less. With the above-described configuration, the reaction at a low exposure dose can be more effectively inhibited.

A mixing ratio between the photopolymerization initiator and the polymerization inhibitor is not particularly limited. From the viewpoint of more effectively exhibiting the effects of the present invention, the amount of the polymerization inhibitor is preferably 10 parts by mass or more, more preferably 20 parts by mass or more, and still more preferably 30 parts by mass or more with respect to 100 parts by mass of the photopolymerization initiator. The upper limit is preferably 100 parts by mass or less, more preferably 70 parts by mass or less, and still more preferably 50 parts by mass or less. With the above-described configuration, the reaction at a low exposure dose can be more effectively inhibited.

One polymerization inhibitor may be used, or a plurality of polymerization inhibitors may be used. In a case where a plurality of polymerization inhibitors are used, it is preferable that the total content of the polymerization inhibitors is in the above-described range.

Specific examples of the polymerization inhibitor include Q-1300, Q-1301, and TBHQ (trade names; manufactured by Wako Pure Chemical Industries, Ltd.), QUINO POWER series (trade name: manufactured by Kawasaki Kasei Chemicals Ltd.), 2,2,6,6-tetramethylpiperidine-1-oxyl free radical, 4-hydroxy-2,2,6,6-tetramethylpiperidine-1-oxyl free radical, and p-benzoquinone.

In the curable composition for imprinting, the total amount of the ultraviolet absorber and the polymerization inhibitor is preferably 1 to 8 mass % and more preferably 2 to 5 mass % with respect to the total amount of the non-volatile components.

<Solvent>

The curable composition for imprinting may include a solvent. The solvent refers to a compound that is liquid at 23° C. and has a boiling point of 250° C. or lower. In a case where the curable composition for imprinting according to the embodiment of the present invention includes a solvent, the content of the solvent is, for example, preferably 1.0 to 99.5 mass %, more preferably 10.0 to 99.0 mass %, and still more preferably 30.0 to 98.0 mass %. The curable composition for imprinting according to the embodiment of the present invention may include only one solvent or two or more solvents. In a case where the curable composition for imprinting according to the embodiment of the present invention includes two or more solvents, it is preferable that the total content of the two or more solvents is in the above-described range.

The boiling point of a component having the highest content among the above-described solvents is preferably 200° C. or lower and more preferably 160° C. or lower. By adjusting the boiling point of the solvent to be the above-described temperature or lower, the solvent in the curable composition for imprinting can be removed during baking. The lower limit value of the boiling point of the solvent is not particularly limited and is practically 60° C. or higher and may be 80° C. or higher and further 100° C. or higher.

It is preferable that the above-described solvent is an organic solvent. It is preferable that the solvent has one or more selected from an ester group, a carbonyl group, an alkoxy group, a hydroxyl group, or an ether group.

Specific example of the solvent can be selected from alkoxy alcohol, propylene glycol monoalkyl ether carboxylate, propylene glycol monoalkyl ether, lactate, acetate, alkoxy propionate, chain-like ketone, cyclic ketone, lactone, or alkylene carbonate.

Examples of the alkoxy alcohol include methoxyethanol, ethoxyethanol, methoxypropanol (for example, 1-methoxy-2-propanol), ethoxypropanol (for example, 1-ethoxy-2-propanol), propoxypropanol (for example, 1-propoxy-2-propanol), methoxybutanol (for example, 1-methoxy-2-butanol or 1-methoxy-3-butanol), ethoxybutanol (for example, 1-ethoxy-2-butanol or 1-ethoxy-3-butanol), and methyl pentanol (for example, 4-methyl-2-pentanol).

As the propylene glycol monoalkyl ether carboxylate, for example, at least one selected from the group consisting of propylene glycol monomethyl ether acetate, propylene glycol monomethyl ether propionate, and propylene glycol monoethyl ether acetate is preferable, and propylene glycol monomethyl ether acetate is more preferable.

In addition, as the propylene glycol monoalkyl ether, propylene glycol monomethyl ether or propylene glycol monoethyl ether is preferable.

As the lactate, ethyl lactate, butyl lactate, or propyl lactate is preferable.

As the acetate, methyl acetate, ethyl acetate, butyl acetate, isobutyl acetate, propyl acetate, isoamyl acetate, methyl formate, ethyl formate, butyl formate, propyl formate, or 3-methoxybutyl acetate is preferable.

As the alkoxy propionate, methyl 3-methoxypropionate (MMP) or ethyl 3-ethoxypropionate (EEP) is preferable.

As the chain-like ketone, 1-octanone, 2-octanone, 1-nonanone, 2-nonanone, acetone, 4-heptanone, 1-hexanone, 2-hexanone, diisobutyl ketone, phenylacetone, methyl ethyl ketone, methyl isobutyl ketone, acetylacetone, acetonylacetone, ionone, diacetonyl alcohol, acetyl carbinol, acetophenone, methyl naphthyl ketone, or methyl amyl ketone is preferable.

As the cyclic ketone, methylcyclohexanone, isophorone, or cyclohexanone is preferable.

As the lactone, γ-butyrolactone is preferable.

As the alkylene carbonate, propylene carbonate is preferable.

It is preferable that, in addition to the above-described components, an ester solvent having 7 or more carbon atoms (preferably 7 to 14 carbon atoms, more preferably 7 to 12 carbon atoms, and still more preferably 7 to 10 carbon atoms) and having two or less heteroatoms is used.

Preferable examples of the ester solvent having 7 or more carbon atoms and 2 or less heteroatom include amyl acetate, 2-methylbutyl acetate, 1-methylbutyl acetate, hexyl acetate, pentyl propionate, hexyl propionate, butyl propionate, isobutyl isobutyrate, heptyl propionate, and butyl butanoate. In particular, isoamyl acetate is preferably used.

In addition, it is also preferable that an ester solvent having a flash point (hereinafter, also referred to as "fp") of 30° C. or higher is used. As the component (M2), propylene glycol monomethyl ether (fp: 47° C.), ethyl lactate (fp: 53° C.), ethyl 3-ethoxypropionate (fp: 49° C.), methyl amyl ketone (fp: 42° C.), cyclohexanone (fp: 44° C.), pentyl acetate (fp: 45° C.), methyl 2-hydroxyisobutyrate (fp: 45° C.), γ-butyrolactone (fp: 101° C.), or propylene carbonate (fp: 132° C.) is preferable. Among these, propylene glycol monoethyl ether, ethyl lactate, pentyl acetate, or cyclohexanone is more preferable, and propylene glycol monoethyl ether or ethyl lactate is still more preferable. Here, "flash point" refers to a value described in a reagent catalog of Tokyo Chemical Industry Co., Ltd. or Sigma-Aldrich Co., Lie.

As the solvent, at least one selected from the group consisting of water, propylene glycol monomethyl ether acetate (PGMEA), ethoxy ethyl propionate, cyclohexanone, 2-heptanone, γ-butyrolactone, butyl acetate, propylene glycol monomethyl ether (PGME), ethyl lactate, and 4-methyl-2-pentanol is preferable, and at least one selected from the group consisting of PGMEA and PGME is more preferable.

<Release Agent>

The kind of the release agent used in the present invention is not particularly limited within a range not departing from the scope of the present invention. It is preferable that the release agent is an additive that is segregated at an interface with the mold and has a function of promoting release from the mold. Specific examples of the release agent include a surfactant and a non-polymerizable compound that has at least one hydroxyl group at a terminal or has a hydroxyl group having an etherified polyalkylene glycol structure and does not substantially include a fluorine atom and a silicon atom (hereinafter, also referred to as "non-polymerizable compound having releasability"). Here, for example, substantially not including a silicon atom represents that the content of silicon atoms is 1 mass % or lower.

In a case where the composition includes a release agent, the content thereof is preferably 0.1 to 20 mass %, more preferably 1 to 10 mass %, and still more preferably 2 to 5 mass %. The composition may include one release agent or two or more release agents. In a case where the curable composition for imprinting according to the embodiment of the present invention includes two or more release agents, it is preferable that the total content of the two or more release agents is in the above-described range.

<<Surfactant>>

As the surfactant, a nonionic surfactant is preferable.

The nonionic surfactant refers to a compound having at least one hydrophobic portion and at least one nonionic hydrophilic portion. Each of the hydrophobic portion and the hydrophilic portion may be present at a terminal of a molecule or in the molecule. The hydrophobic portion is formed of a hydrophobic group selected from the group consisting of a hydrocarbon group, a fluorine-containing group, and a Si-containing group, and the number of carbon atoms in the hydrophobic portion is preferably 1 to 25, more preferably 2 to 15, still more preferably 4 to 10, and still more preferably 5 to 8. It is preferable that the nonionic hydrophilic portion has at least one group selected from the group consisting of an alcoholic hydroxyl group, a phenolic hydroxyl group, an ether group (preferably a polyoxyalkylene group or a cyclic ether group), an amido group, an imido group, an ureido group, a urethane group, a cyano group, a sulfonamide group, a lactone group, a lactam group, and a cyclocarbonate group. As the nonionic surfactant, a hydrocarbon nonionic surfactant, a fluorine nonionic surfactant, a Si nonionic surfactant, or a fluorine-Si nonionic surfactant may be used, a fluorine nonionic surfactant or a Si nonionic surfactant is more preferable, and a fluorine nonionic surfactant is still more preferable. Here, "fluorine-Si surfactant" refers to a surfactant having both requirements of a fluorine surfactant and a Si surfactant.

Examples of a commercially available product of the fluorine nonionic surfactant include: FLUORAD FC-4430 and FC-4431 (manufactured by Sumitomo 3M Ltd.); SURFLON S-241, S-242, and S-243 (manufactured by Asahi Glass Co., Ltd.); F-TOP EF-PN31M-03, EF-PN31M-04, EF-PN31M-05, EF-PN31M-06, and MF-100 (manufactured by Mitsubishi Materials Corporation); PolyFox PF-636, PF-6320, PF-656, and PF-6520 (manufactured by OMNOVA Solutions Inc.); FTERGENT 250, 251, 222F, 212M, and DFX-18 (manufactured by Neos Co., Ltd.); UNIDYNE DS-401, DS-403, DS-406, DS-451, and DSN-403N (manufactured by Daikin Industries, Ltd.); MEGAFACE F-430, F-444, F-477, F-553, F-556, F-557, F-559, F-562, F-565, F-567, F-569, and R-40 (manufactured by DIC Corporation); and Capstone FS-3100 and ZONYL FSO-100 (manufactured by DuPont).

In a case where the curable composition for imprinting according to the embodiment of the present invention includes the surfactant, the content of the surfactant is preferably 0.1 to 10 mass %, more preferably 0.2 to 5 mass %, and still more preferably 0.5 to 5 mass % with respect to the total content of the composition excluding the solvent. The curable composition for imprinting may include one surfactant or two or more surfactants. In a case where the infrared absorbing composition includes two or more surfactants, it is preferable that the total content of the two or more surfactants is in the above-described range.

<<Non-Polymerizable Compound Having Releasability>>

The curable composition for imprinting may include a non-polymerizable compound that has at least one hydroxyl group at a terminal or has a hydroxyl group having an etherified polyalkylene glycol structure and does not substantially include a fluorine atom and a silicon atom (in this specification, also referred to as "non-polymerizable compound having releasability"). Here, the non-polymerizable compound refers to a compound not having a polymerizable group. In addition, substantially not including a fluorine atom and a silicon atom represents that, for example, the total content of a fluorine atom and a silicon atom is 1 mass % or lower, and it is preferable that a fluorine atom and a silicon atom are not completely included. By the curable composition for imprinting not including a fluorine atom and a silicon atom, compatibility with the polymerizable compound can be improved. In particular, in the curable composition for imprinting that does not substantially include the solvent, coating uniformity, pattern formability during imprint, and line edge roughness after dry etching are improved.

As the polyalkylene glycol structure included in the non-polymerizable compound having releasability, a polyalkylene structure that includes an alkylene group having 1 to 6 carbon atoms is preferable, a polyethylene glycol structure, a polypropylene glycol structure, a polybutylene glycol structure, or a mixed structure thereof is more preferable, a polyethylene glycol structure, a polypropylene glycol structure, or a mixed structure thereof is more preferable, and a polypropylene glycol structure is still more preferable.

Further, the non-polymerizable compound may substantially consist of only the polyalkylene glycol structure excluding the terminal substituent. Here, "substantially" represents that the content of components other than the polyalkylene glycol structure is 5 mass % or lower and preferably 1 mass % or lower with respect to the total content of the non-polymerizable compound. In particular, it is preferable that a compound that substantially consists of only the polypropylene glycol structure is included as the non-polymerizable compound having releasability.

As the polyalkylene glycol structure, it is preferable that 3 to 100 alkylene glycol constitutional units are included, it is more preferable that 4 to 50 alkylene glycol constitutional units are included, it is still more preferable that 5 to 30 alkylene glycol constitutional units are included, and it is even still more preferable that 6 to 20 alkylene glycol constitutional units are included.

It is preferable that the non-polymerizable compound having releasability has at least one hydroxyl group at a terminal or has a hydroxyl group that is etherified. As long as the non-polymerizable compound having releasability has at least one hydroxyl group at a terminal or has a hydroxyl group that is etherified, even in a case where the remaining terminal group is a hydroxyl group, a hydrogen atom in the terminal hydroxyl group may be substituted. As a group which may be substituted with the hydrogen atom in the terminal hydroxyl group, an alkyl group (that is, polyalkylene glycol alkyl ether) or an acyl group (that is, polyalkylene glycol ester) is preferable. A compound including a plurality of (preferably two or three) polyalkylene glycol chains through a linking group can also be preferably used.

Specific preferable examples of the non-polymerizable compound having releasability include polyethylene glycol, polypropylene glycol (for example, manufactured by Wako Pure Chemical Industries, Ltd.), mono- or dimethyl ether, mono- or dibutyl ether, mono- or dioctyl ether, mono- or dicetyl ether, monostearic acid ester, monooleic acid ester, polyoxyethylene glyceryl ether, polyoxypropylene glyceryl ether, and trimethyl ether thereof.

The weight-average molecular weight of the non-polymerizable compound having releasability is preferably 150 to 6000, more preferably 200 to 3000, still more preferably 250 to 2000, and still more preferably 300 to 1200.

In addition, examples of the non-polymerizable compound having releasability which can be used in the present invention include a non-polymerizable compound having releasability which has an acetylene diol structure. Examples of a commercially available product of the non-polymerizable compound having releasability include OLFINE E1010 (manufactured by Nissin Chemical Co., Ltd.).

In addition, in a case where the curable composition for imprinting according to the embodiment of the present invention includes the non-polymerizable compound having releasability, the total content thereof is preferably 0.1 to 20 mass %, more preferably 1 to 10 mass %, and still more preferably 2 to 5 mass %. The curable composition for imprinting according to the embodiment of the present invention may include one non-polymerizable compound having releasability or two or more non-polymerizable compounds having releasability. In a case where the curable composition for imprinting according to the embodiment of the present invention includes two or more non-polymerizable compounds having releasability, it is preferable that the total content of the two or more non-polymerizable compounds having releasability is in the above-described range.

<Other Components>

The curable composition for imprinting according to the embodiment of the present invention may also include other components. The curable composition for imprinting according to the embodiment of the present invention may include, for example, a monofunctional polymerizable compound, a sensitizer, and an antioxidant. The content is not particularly limited and may be about 0 to 20 mass % with respect to the non-volatile components. The details of the monofunctional polymerizable compound can be found in, for example, paragraphs "0022" to "0024" of JP2014-

170949A and paragraphs "0029" to "0034" of JP2013-189537A, the contents of which are incorporated herein by reference.

Examples of a preferred embodiment of the curable composition for imprinting according to the present invention include a composition that substantially consists of only a polymerizable compound, a photopolymerization initiator, at least one of an ultraviolet absorber or a polymerization inhibitor, a solvent, and a release agent (including a surfactant). "substantially consists of only to" represents that the total content of the above-described components is 95 mass % or higher and preferably 99 mass % or higher with respect to all the components of the curable composition for imprinting.

The curable composition for imprinting according to the embodiment of the present invention may be filtered before use. For filtering, for example, an ultra high molecular weight polyethylene (UPE) filter or a polytetrafluoroethylene (PTFE) filter can be used. In addition, the pore size of the filter is preferably 0.0005 μm to 5.0 μm. The details of filtering can be found in paragraph "0070" of JP2014-170949A, the contents of which are incorporated herein by reference.

As a storage container of the curable composition for imprinting according to the embodiment of the present invention a well-known storage container of the related art can be used. In addition, as the storage container, in order to suppress infiltration of impurities into the raw materials or the composition, a multilayer bottle in which a container inner wall having a six-layer structure is formed of six kinds of resins or a bottle in which a container inner wall having a seven-layer structure is formed of six kinds of resins is preferably used. Examples of the container include a container described in JP2015-123351A.

<Reaction Rate>

In the curable composition for imprinting according to the embodiment of the present invention, in a case where the curable composition for imprinting is applied to a silicon substrate at a thickness of 80 nm and is irradiated with light having a wavelength of 365 nm at an exposure dose of 10 mJ/cm$^2$ in an atmosphere having an oxygen concentration of 3%, a reaction rate of a polymerizable group is preferably 50% or lower, more preferably 40% or lower, and still more preferably 20% or lower. According to the preferred embodiment of the present invention, the reactivity during light irradiation at a low exposure dose under the above-described conditions is inhibited. Therefore, the progress of an excessive reaction in an adjacent portion can be suitably inhibited.

<Cured Product and Method of Manufacturing Cured Product Pattern>

A pattern forming method according to the embodiment of the present invention includes a step of applying the curable composition for imprinting according to the embodiment of the present invention to a substrate, an underlayer film, an adhesion layer, or the like. It is preferable that the curable composition for imprinting is applied to the substrate using a spin coating method.

As the underlayer film or the adhesion layer, for example, an underlayer film or an adhesion layer described in paragraphs "0017" to "0068" of JP2014-024322A, an underlayer film or an adhesion layer described in paragraphs "0016" to "0044" of JP2013-093552A, an adhesive film described in JP2014-093385A, or an adhesion layer described in JP2013-202982A can be used, the contents of which are incorporated herein by reference.

In a case where a cured product pattern is manufactured using the curable composition for imprinting according to the embodiment of the present invention, it is preferable that an imprinting method is performed through a step and repeat process. The step and repeat process is the mold processing process shown in FIGS. 1A to 1C.

In photonanoimprint lithography in which the curable composition for imprinting is used, a light-transmitting material is selected as at least one of a mold material or a substrate. In one embodiment, the curable composition for imprinting is applied to the substrate to form a pattern-forming layer, a light-transmitting mold is pressed into contact with a surface of the pattern-forming layer, and the mold is irradiated with light from a back surface thereof to cure the above-described pattern-forming layer. In addition, in another embodiment, the curable composition for imprinting is applied to the light-transmitting substrate, the mold is pressed against the curable composition for imprinting, and the substrate is irradiated with light from a back surface thereof. As a result, the curable composition for imprinting can also be cured.

The above-described light irradiation may be performed in a state where the mold adheres to the curable composition for imprinting or may be performed after the mold is released. It is preferable that the above-described light irradiation is performed in a state where the mold adheres to the curable composition for imprinting.

In addition, it is preferable that a mold having a pattern to be transferred is used as the mold. The pattern on the mold can be formed, for example, by photolithography, electron beam lithography, or the like depending on a desired processing accuracy. However, a mold pattern forming method is not particularly limited. In addition, the pattern formed using the pattern forming method can also be used as the mold.

A light-transmitting mold material is not particularly limited as long as it has a predetermined strength and durability. Specific examples of the light-transmitting mold material include glass, quartz, a light-transmitting resin such as PMMA or a polycarbonate resin, a transparent metal deposited film, a flexible film such as polydimethylsiloxane, a photocured film, and a metal film.

On the other hand, a light non-transmitting mold material used in a case where the light-transmitting substrate is used is not particularly limited as long as it has a predetermined strength. Specific examples of the non-transmitting mold material include a ceramic material, a deposited film, a magnetic film, a reflection film, a metal substrate such as Ni, Cu, Cr, or Fe, and a substrate formed of SiC, silicon, silicon nitride, polysilicon, silicon oxide, amorphous silicon, or the like. However, the present invention is not limited to these examples.

In a case where imprinting is performed using the curable composition for imprinting, typically, it is preferable that the mold pressure is 10 atm or lower. By adjusting the mold pressure to be 10 atm or lower, the mold or the substrate is not likely to be deformed, and the pattern accuracy tends to be improved. In addition, since the pressure is low, the size of the device tends to be capable of being reduced, which is preferable. It is preferable that the mold pressure is selected in a range where the uniformity of mold transfer can be secured and the residue film of the curable composition for imprinting in a mold protrusion portion can be reduced.

In the step of irradiating the curable composition layer for imprinting with light, the irradiation dose of light irradiation is not particularly limited as long as it is sufficiently higher than an irradiation dose required for curing. The irradiation dose required for curing is appropriately determined by investigating, for example, the consumption of an unsaturated bond in the curable composition for imprinting. However, in the present invention, in order to prevent the excessive curing of the mold adjacent portion, it is preferable that irradiation is performed at a low exposure dose.

The substrate temperature during light irradiation is typically room temperature. However, in order to improve reactivity, light irradiation may be performed while heating the substrate. As a step prior to light irradiation, vacuum conditioning is effective for preventing incorporation of bubbles, suppressing a decrease in reactivity caused by incorporation of oxygen, and improving adhesiveness between the mold and the curable composition for imprinting. Therefore, light irradiation may be performed in a vacuum state. In addition, the vacuum degree during light irradiation is preferably in a range of $10^{-1}$ Pa to normal pressure.

During exposure, the exposure illuminance is preferably in a range of 1 mW/cm$^2$ to 500 mW/cm$^2$. In a preferred embodiment of the present invention, in consideration of the use in the nanoimprinting process of the step and repeat process, the exposure illuminance is preferably 10 mW/cm$^2$ or higher, more preferably 100 mW/cm$^2$ or lower, and still more preferably 200 mW/cm$^2$ or lower from the viewpoint of throughput (reduction in exposure time).

The exposure time is preferably 1.0 sec or shorter, more preferably 0.5 sec or shorter, and still more preferably 0.2 sec or shorter. The lower limit value is practically 0.01 sec or longer.

After curing the pattern-forming layer (the layer formed of the curable composition for imprinting) by light irradiation, a step of applying heat to the cured pattern to further cure the pattern may be optionally provided. The temperature at which the composition according to the embodiment of the present invention is heated and cured after light irradiation is preferably 150° C. to 280° C. and more preferably 200° C. to 250° C. In addition, the heating time is applied is preferably 5 to 60 minutes and more preferably 15 minutes to 45 minutes.

In the pattern forming method according to the embodiment of the present invention, it is preferable that a step and repeat process of dividing the wafer into a plurality of areas to be imprinted and repeating the pressing and the exposure multiple times is adopted. The distance between adjacent shots is about 10 to 100 μm.

In one embodiment of the present invention, for example, a method of manufacturing a circuit substrate including the pattern forming method according to the embodiment of the present invention can be adopted.

In addition, one embodiment of the present invention is a cured product that is formed of the curable composition for imprinting. It is preferable that the curable composition for imprinting according to the embodiment of the present invention is used as a cured product that is photocured. More specifically, the curable composition for imprinting according to the embodiment of the present invention is used to form a pattern using a photoimprint method.

A cured product pattern that is obtained using the pattern forming method according to the embodiment of the present invention can be used for various applications. For example, the cured product pattern is also applicable to a permanent film such as an overcoat layer or an insulating film that is used in a liquid crystal display (LCD) or the like, a semiconductor integrated circuit, a recording material, or an etching resist in a flat panel display or the like. In particular, the cured product pattern according to the preferred embodiment of the present invention has excellent etching resistance and can be preferably used as an etching resist of dry etching in which fluorocarbon or the like is used.

EXAMPLES

Hereinafter, the present invention will be described in detail using examples. Materials, used amounts, ratios, treatment details, treatment procedures, and the like shown in the following examples can be appropriately changed within a range not departing from the scope of the present invention. Accordingly, the scope of the present invention is not limited to the following specific examples.

Examples 1 to 27 and Comparative Examples 1 to 8

<Preparation of Curable Compositions for Imprinting>

Compounds shown in the following Tables 3 to 5 were mixed with each other, and the obtained mixture was filtered through an ultra high molecular weight polyethylene (UPE) filter having a pore size of 0.05 μm and a UPE filter having a pore size of 0.001 μm in two stages. This way, curable compositions for imprinting were prepared.

<Evaluation of Film Thickness Stability>

An underlayer film-forming composition according to Example 6 of JP2014-024322A was applied to a silicon wafer by spin coating and was heated using a hot plate at 220° C. for 1 minute to form an adhesion layer having a thickness of 5 nm. Next, a curable composition for imprinting including the respective components shown in Tables 3 to 5 was applied to a surface of the adhesion layer by spin coating and was heated using a hot plate at 80° C. for 1 minute to form a curable composition layer for imprinting (film) on the adhesion layer. Immediately after forming the film, the thickness (FT1) of the film was measured using an ellipsometer. Further, after leaving the film to stand for 24 hours, the thickness (FT2) of the film was measured again to calculate a difference in thickness $\Delta FT$ ($=| FT1-FT2|$).

A: $\Delta FT \leq 5.0$ nm
B: $5.0$ nm$<\Delta FT \leq 10$ nm
C: $10$ nm$<\Delta FT \leq 20$ nm
D: $\Delta FT > 20$ nm <Evaluation of Film Thickness Uniformity>

An adhesion layer-forming composition according to Example 6 of JP2014-024322A was applied to a silicon wafer by spin coating and was heated using a hot plate at 220° C. for 1 minute to form an adhesion layer having a thickness of 5 nm. Next, a curable composition for imprinting including the respective components shown in Tables 3 to 5 was applied to a surface of the adhesion layer by spin coating and was heated using a hot plate at 80° C. for 1 minute to form a curable composition layer for imprinting having a thickness of 80 nm on the adhesion layer. Thicknesses of ten points in a plane were measured to measure film thickness uniformity 3σ using an ellipsometer.

A: $3\sigma \leq 0.5$ nm
B: $0.5$ nm$<3\sigma \leq 1.0$ nm
C: $1.0$ nm$<3\sigma \leq 3.0$ nm
D: $3\sigma > 3.0$ nm <Evaluation of Releasing Force>

An adhesion layer-forming composition according to Example 6 of JP2014-024322A was applied to a silicon wafer by spin coating and was heated using a hot plate at 220° C. for 1 minute to form an adhesion layer having a thickness of 5 nm. Further, a curable composition for imprinting was applied to the adhesion layer by spin coating and was heated using a hot plate at 80° C. for 1 minute to form a pattern-forming layer having a thickness of 80 nm. Next, a quartz mold (a line pattern having a line width of 20 nm and a depth of 50 nm) was pressed into contact with the pattern-forming layer in a He atmosphere (substitution ratio: 90% or higher) to fill the mold with the curable composition for imprinting. 10 seconds after pressing the mold into contact with the pattern-forming layer, the mold side was exposed to light using a high pressure mercury lamp under conditions of maximum emission wavelength of irradiation light source: 365 nm, exposure illuminance: 10 mW/cm$^2$, and exposure time: 15 seconds (exposure dose: 150 mJ/cm$^2$). Next, by releasing the mold, the pattern was transferred to the pattern-forming layer. A releasing force required for releasing the mold was measured using a load cell.

A: Releasing Force≤15 N
B: 15 N<Releasing Force≤20 N
C: 20 N<Releasing Force≤25 N
D: Releasing Force>25 N <Evaluation of Resolution Ability>

An adhesion layer-forming composition according to Example 6 of JP2014-024322A was applied to a silicon wafer by spin coating and was heated using a hot plate at 220° C. for 1 minute to form an adhesion layer having a thickness of 5 nm. Further, a curable composition for imprinting was applied to the adhesion layer by spin coating and was heated using a hot plate at 80° C. for 1 minute to form a pattern-forming layer having a thickness of 80 nm. Next, a quartz mold (a line pattern having a line width of 28 nm and a depth of 60 nm) was pressed into contact with the pattern-forming layer in a He atmosphere (substitution ratio: 90% or higher) to fill the mold with the curable composition for imprinting. 10 seconds after pressing the mold into contact with the pattern-forming layer, the mold side was exposed to light using a high pressure mercury lamp under conditions of maximum emission wavelength of irradiation light source: 365 nm, exposure illuminance: 10 mW/cm$^2$, and exposure time: 15 seconds (exposure dose: 150 mJ/cm$^2$). Next, by releasing the mold, the pattern was transferred to the pattern-forming layer. Whether or not pattern collapse occurred in the transferred pattern was checked by observation using a scanning electron microscope (SEM).

A: pattern collapse and pattern edge roughening were not observed
B: pattern collapse was not observed, but pattern edge roughening was observed
C: collapse was observed in a part of a pattern transferred region.
D: collapse was observed in the entire region of the pattern transferred region.

<Evaluation of Curing Properties During Irradiation at Low Exposure Dose>

An adhesion layer-forming composition according to Example 6 of JP2014-024322A was applied to a silicon wafer by spin coating and was heated using a hot plate at 220° C. for 1 minute to form an adhesion layer having a thickness of 5 nm. Further, a curable composition for imprinting was applied to the adhesion layer by spin coating and was heated using a hot plate at 80° C. for 1 minute to form a pattern-forming layer having a thickness of 80 nm. The obtained pattern-forming layer was exposed using a high-pressure mercury lamp (maximum emission wavelength of irradiation light source: 365 nm, exposure illuminance: 10 mW/cm$^2$) in a He atmosphere (substitution ratio 97%) for 1 second.

Next, a quartz mold (a hole pattern having a CD of 20 nm and a depth of 40 nm) was pressed into contact with the exposed pattern-forming layer in a He atmosphere (substitution ratio: 90% or higher) to fill the mold with the curable composition for imprinting. 10 seconds after pressing the mold into contact with the pattern-forming layer, the mold side was exposed to light using a high pressure mercury lamp under conditions of maximum emission wavelength of irradiation light source: 365 nm, exposure illuminance: 10 mW/cm$^2$, and exposure time: 15 seconds (exposure dose: 150 mJ/cm$^2$). Next, by releasing the mold, the pattern was transferred to the pattern-forming layer. A height h of the formed pattern was measured using a cross-sectional SEM. The height being sufficient represents that the reaction during irradiation at a low exposure dose was inhibited in the curable composition for imprinting.

A: h≥38 nm
B: 32 nm≤h<38 nm
C: 25 nm≤h<32 nm
D: h<25 nm
E: a pattern was not able to be formed (insufficient curing)

<Evaluation of Reaction Rate (Excessive Reaction Inhibiting Properties) During Irradiation at Low Exposure Dose>

An adhesion layer-forming composition according to Example 6 of JP2014-024322A was applied to a silicon wafer by spin coating and was heated using a hot plate at 220° C. for 1 minute to form an adhesion layer having a thickness of 5 nm. Further, a curable composition for imprinting was applied to the adhesion layer by spin coating and was heated using a hot plate at 80° C. for 1 minute to form a pattern-forming layer having a thickness of 80 nm. The obtained pattern-forming layer was exposed using a high-pressure mercury lamp (maximum emission wavelength of irradiation light source: 365 nm, exposure illuminance: 10 mW/cm$^2$) in a He atmosphere (substitution ratio 97%, oxygen concentration: 3%) for 1 second.

The reaction rate ($\phi$) of the exposed curable composition for imprinting was measured by FT-IR. Regarding the reaction rate, a consumption rate (reaction rate) of a vinyl group derived from an acrylate was calculated from a change before and after exposure in out-of-plane bending vibration band (820-800 cm$^{-1}$) of a vinyl group CH. The reaction rate being low represents that the progress of curing caused by light leak (irradiation at a low exposure dose) was inhibited.

A: $\phi$≤20%
B: 20%<$\phi$≤50%
C: 50%<$\phi$≤60%
D: $\phi$>60%

<Measurement of Absorption Coefficient>

The light absorption coefficients [ε] (unit: mL/g·cm) of the polymerization initiator and the ultraviolet absorber were measured using a spectrophotometer. Each of the materials was diluted into 0.001 mass/vol % with methanol to obtain a sample solution. A quartz cell (optical path length: 1 cm) was filled with the prepared sample solution, and an absorbance and a light absorption coefficient were measured using a spectrophotometer. The measurement wavelength range was 200 to 500 nm, the measurement interval was 1 nm, and the sweep rate was 400 nm/min. The details regarding the measurement procedure or the like were based on JIS K 0115:2004. Two samples were prepared for each level and the measurement was performed three times. Six arithmetic mean values in total were adopted as evaluation values. The results are shown in Table 7.

<Viscosity>

The viscosity of the polymerizable compound was measured at 23° C. using a RE-80L type rotary viscometer (manufactured by Toki Sangyo Co., Ltd.). The rotation speed during the measurement was as shown in Table 2 below depending on the viscosity. The results are shown in Table 6.

TABLE 2

| Viscosity | Appropriate Rotation Speed |
|---|---|
| 0.001 to 6.076 mPa·s | 100 rpm |
| 6.077 to 12.15 mPa·s | 50 rpm |
| 12.16 to 30.38 mPa·s | 20 rpm |
| 30.39 to 60.76 mPa·s | 10 rpm |
| 60.77 to 121.5 mPa·s | 5 rpm |
| 121.6 to 303.8 mPa·s | 2 rpm |
| 303.9 to 607.6 mPa·s | 1 rpm |
| 607.7 to 1215 mPa·s | 0.5 rpm |
| 1216 to 2025 mPa·s | 0.3 rpm |

TABLE 3

| | | Example 1 | Example 2 | Example 3 | Example 4 | Example 5 | Example 6 |
|---|---|---|---|---|---|---|---|
| Polymerizable Compound | A-1 | 90 | | | 50 | | 70 |
| | A-2 | | 90 | | | | |
| | A-3 | | | 90 | | 50 | |
| | A-4 | | | | 40 | | |
| | A-5 | | | | | 40 | |
| | A-6 | | | | | | 20 |
| | A-7 | | | | | | |
| Photopolymerization Initiator | B-1 | 3 | 3 | 3 | 3 | | 3 |
| | B-2 | | | | | 3 | |
| | B-3 | | | | | | |
| | B-4 | | | | | | |
| Ultraviolet Absorber | C-1 | 4 | 4 | 4 | 3 | 3 | 4 |
| | C-2 | | | | | | |
| | C-3 | | | | | | |
| | C-4 | | | | | | |
| | C-5 | | | | | | |
| Polymerization Inhibitor | F-1 | | | | 1 | 1 | |
| | F-2 | | | | | | |
| | F-3 | | | | | | |
| Release Agent | E-1 | 3 | 3 | 3 | 3 | | 3 |
| | E-2 | | | | | 3 | |
| | E-3 | | | | | | |
| Total Concentration of A to C, E, and F | | 100 | 100 | 100 | 100 | 100 | 100 |
| Kind of Solvent | | D-1 | D-1 | D-1 | D-1 | D-1 | D-1 |
| Non-volatile Component Concentration | | 4 | 4 | 4 | 4 | 4 | 4 |
| Film Thickness Stability | | A | A | A | A | A | A |
| Film Thickness Uniformity | | A | A | A | A | A | A |
| Releasing Force | | A | A | A | A | A | A |
| Resolution Ability | | A | A | A | A | A | A |
| Curing Properties during Irradiation at Low Exposure Dose | | A | A | A | A | A | A |
| Reaction Rate during Irradiation at Low Exposure Dose | | A | A | A | A | A | A |

| | | Example 7 | Example 8 | Example 9 | Example 10 | Example 11 | Example 12 |
|---|---|---|---|---|---|---|---|
| Polymerizable Compound | A-1 | 70 | 92 | 92 | 92 | | |
| | A-2 | | | | | | |
| | A-3 | | | | | 90 | 90 |
| | A-4 | | | | | | |
| | A-5 | | | | | | |
| | A-6 | | | | | | |
| | A-7 | 20 | | | | | |
| Photopoly- | B-1 | 3 | 3 | 3 | 3 | | |
| | B-2 | | | | | 3 | |

TABLE 3-continued

| | | | | | | | |
|---|---|---|---|---|---|---|---|
| merization | B-3 | | | | | | 3 |
| Initiator | B-4 | | | | | | |
| Ultraviolet | C-1 | 4 | | | | 3 | 3 |
| Absorber | C-2 | | | | | | |
| | C-3 | | | | | | |
| | C-4 | | | | | | |
| | C-5 | | | | | | |
| Poly- | F-1 | | 2 | | | | |
| merization | F-2 | | | 2 | | 1 | |
| Inhibitor | F-3 | | | | 2 | | 1 |
| Release | E-1 | 3 | 3 | 3 | 3 | | |
| Agent | E-2 | | | | | 3 | |
| | E-3 | | | | | | 3 |
| Total Concentration of A to C, E, and F | | 100 | 100 | 100 | 100 | 100 | 100 |
| Kind of Solvent | | D-1 | D-1 | D-2 | D-3 | D-1 | D-1 |
| Non-volatile Component Concentration | | 4 | 4 | 4 | 4 | 4 | 4 |
| Film Thickness Stability | | A | A | A | A | A | A |
| Film Thickness Uniformity | | A | A | A | A | A | A |
| Releasing Force | | A | A | A | A | A | A |
| Resolution Ability | | A | A | A | A | A | A |
| Curing Properties during Irradiation at Low Exposure Dose | | A | A | A | A | A | A |
| Reaction Rate during Irradiation at Low Exposure Dose | | A | A | A | A | A | A |

TABLE 4

| | | Example 13 | Example 14 | Example 15 | Example 16 | Example 17 | Example 18 | Example 19 | Example 20 | Example 21 | Example 22 | Example 23 | Example 24 |
|---|---|---|---|---|---|---|---|---|---|---|---|---|---|
| Polymerizable Compound | A-1 | | 88.5 | | | | 90 | | 92.6 | 87 | 44 | | |
| | A-2 | | | | 91 | | | 90 | | | | | |
| | A-3 | 90 | | 88 | | 91 | | | | | | | |
| | A-4 | | | | | | | | | | | 96 | |
| | A-5 | | | | | | | | | | | | 93.5 |
| | A-6 | | | | | | | | | | 46 | | |
| | A-7 | | | | | | | | | | | | |
| Photopolymerization Initiator | B-1 | 2 | 4 | 3 | | 3 | | | 0.4 | 6 | 3 | 2 | 1 |
| | B-2 | | | | | | 3 | | | | | | |
| | B-3 | | | | 3 | | | 2 | | | | | |
| | B-4 | 2 | | | | | | 1 | | | | | |
| | C-1 | 2 | 0.5 | 6 | | | | | 4 | 4 | 4 | 1 | |
| | C-2 | | | | 3 | | | | | | | | |
| Ultraviolet Absorber | C-3 | | | | | 3 | | | | | | | |
| | C-4 | | | | | | 4 | | | | | | |
| | C-5 | | | | | | | 4 | | | | | |
| Polymerization Inhibitor | F-1 | 1 | 4 | | | | | | | | | | 0.5 |
| | F-2 | | | | | | | | | | | | |
| | F-3 | | | | | | | | | | | | |
| | E-1 | 3 | 3 | | | 3 | 3 | 3 | 3 | 3 | 3 | 1 | 5 |
| Release Agent | E-2 | | | 3 | 3 | | | | | | | | |
| | E-3 | | | | | | | | | | | | |
| Total Concentration of A to C, E, and F | | 100 | 100 | 100 | 100 | 100 | 100 | 100 | 100 | 100 | 100 | 100 | 100 |
| Kind of Solvent | | D-1 | D-1 | D-1 | D-4 | D-1 | D-1 | D-1 | D-1 | D-1 | D-2 | D-3 | D-4 |
| Non-volatile Component Concentration | | 4 | 4 | 4 | 4 | 4 | 4 | 4 | 4 | 4 | 4 | 4 | 4 |
| Film Thickness Stability | | A | A | A | A | A | A | A | A | A | B | B | B |
| Film Thickness Uniformity | | A | A | A | A | A | A | A | A | A | B | A | A |

TABLE 4-continued

|  | Example 13 | Example 14 | Example 15 | Example 16 | Example 17 | Example 18 | Example 19 | Example 20 | Example 21 | Example 22 | Example 23 | Example 24 |
|---|---|---|---|---|---|---|---|---|---|---|---|---|
| Releasing Force | A | A | A | A | A | B | B | A | A | A | B | A |
| Resolution Ability | A | A | A | A | A | B | B | B | A | A | A | A |
| Curing Properties during Irradiation at Low Exposure Dose | A | A | A | A | A | A | B | A | B | B | B | B |
| Reaction Rate during Irradiation at Low Exposure Dose | A | A | A | B | B | B | B | A | B | B | B | B |

TABLE 5

|  |  | Comparative Example 1 | Comparative Example 2 | Comparative Example 3 | Comparative Example 4 | Comparative Example 5 | Comparative Example 6 |
|---|---|---|---|---|---|---|---|
| Polymerizable Compound | A-1 | 94 | 94 | 93.6 | 85 |  |  |
|  | A-2 |  |  |  |  | 93.91 | 88 |
|  | A-3 |  |  |  |  |  |  |
|  | A-4 |  |  |  |  |  |  |
|  | A-5 |  |  |  |  |  |  |
|  | A-6 |  |  |  |  |  |  |
|  | A-7 |  |  |  |  |  |  |
| Photo-polymerization Initiator | B-1 | 3 | 3 | 3 | 3 |  |  |
|  | B-2 |  |  |  |  | 3 | 3 |
|  | B-3 |  |  |  |  |  |  |
|  | B-4 |  |  |  |  |  |  |
| Ultraviolet Absorber | C-1 |  |  | 0.4 | 9 |  |  |
|  | C-2 |  |  |  |  |  |  |
|  | C-3 |  |  |  |  |  |  |
|  | C-4 |  |  |  |  |  |  |
|  | C-5 |  |  |  |  |  |  |
| Polymerization Inhibitor | F-1 |  |  |  |  | 0.09 | 6 |
|  | F-2 |  |  |  |  |  |  |
|  | F-3 |  |  |  |  |  |  |
| Release Agent | E-1 | 3 | 3 | 3 | 3 | 3 | 3 |
|  | E-2 |  |  |  |  |  |  |
|  | E-3 |  |  |  |  |  |  |
| Total Concentration of A to C, E, and F |  | 100 | 100 | 100 | 100 | 100 | 100 |
| Kind of Solvent |  | D-1 | D-1 | D-1 | D-1 | D-1 | D-1 |
| Non-volatile Component Concentration |  | 4 | 4 | 4 | 4 | 4 | 4 |
| Film Thickness Stability |  | A | A | A | A | A | A |
| Film Thickness Uniformity |  | A | A | A | A | A | A |
| Releasing Force |  | A | A | A | A | A | A |
| Resolution Ability |  | A | A | A | D | A | D |
| Curing Properties during Irradiation at Low Exposure Dose |  | D | D | C | E | D | E |
| Reaction Rate during Irradiation at Low Exposure Dose |  | D | D | D | A | D | A |

|  |  | Comparative Example 7 | Comparative Example 8 | Example 25 | Example 26 | Example 27 |
|---|---|---|---|---|---|---|
| Polymerizable Compound | A-1 |  |  | 50 | 50 | 50 |
|  | A-2 |  |  |  |  |  |
|  | A-3 |  |  |  |  |  |
|  | A-4 |  |  | 40 | 40 | 40 |
|  | A-5 |  |  |  |  |  |
|  | A-6 | 90 |  |  |  |  |
|  | A-7 |  | 90 |  |  |  |
| Photo-polymerization Initiator | B-1 | 3 | 3 | 3 | 3 | 3 |
|  | B-2 |  |  |  |  |  |
|  | B-3 |  |  |  |  |  |
|  | B-4 |  |  |  |  |  |
| Ultraviolet Absorber | C-1 | 4 | 4 | 3 | 3 | 3 |
|  | C-2 |  |  |  |  |  |
|  | C-3 |  |  |  |  |  |
|  | C-4 |  |  |  |  |  |
|  | C-5 |  |  |  |  |  |

TABLE 5-continued

| | | | | | | |
|---|---|---|---|---|---|---|
| Polymerization Inhibitor | F-1 | | | 3 | 0.1 | 5 |
| | F-2 | | | | | |
| | F-3 | | | | | |
| Release Agent | E-1 | 3 | 3 | 3 | 3 | 3 |
| | E-2 | | | | | |
| | E-3 | | | | | |
| Total Concentration of A to C, E, and F | | 100 | 100 | 102 | 99.1 | 104 |
| Kind of Solvent | | D-1 | D-1 | D-1 | D-1 | D-1 |
| Non-volatile Component Concentration | | 4 | 4 | 4 | 4 | 4 |
| Film Thickness Stability | | A | A | A | A | A |
| Film Thickness Uniformity | | A | A | A | A | A |
| Releasing Force | | A | A | A | A | A |
| Resolution Ability | | A | A | A | A | B |
| Curing Properties during Irradiation at Low Exposure Dose | | D | D | A | B | A |
| Reaction Rate during Irradiation at Low Exposure Dose | | D | D | A | B | A |

As can be seen from Tables 3 to 5, with the curable composition for imprinting according to the embodiment of the present invention, sufficient curing properties were obtained even during irradiation at a low exposure dose, and the reaction rate was inhibited to be low during irradiation at a low exposure dose, for example, during irradiation of leakage light (Examples 1 to 27). As a result, in a case where the mold portion is exposed, sufficient curing properties were able to be obtained even at a low exposure dose, and wide and excessive curing of the adjacent portion caused by light leak was able to be inhibited. In addition, it was found that excellent performance was exhibited in various physical properties required for the nanoimprinting process, for example, film thickness stability, uniformity, low releasing force, or high resolution ability. On the other hand, with the compositions according to Comparative Examples in which the conditions A to C of the present invention were not satisfied, the curing properties of the exposed and irradiated portion were insufficient (Comparative Examples 1 to 8), and the reaction rate during irradiation at a very low exposure dose was not sufficiently inhibited (Comparative Examples 1 to 3, 5, 7, and 8).

The details of the compounds used in Tables 3 to 5 are as follows.

Polymerizable Compounds

TABLE 6

| No. | Compound | Molecular Weight | Number of Polymerizable Groups | Polymerizable Group Equivalent | Viscosity at 23° C. (mPa·s) | Note |
|---|---|---|---|---|---|---|
| A-1 | (structure with m + n = 20) | 1216 | 2 | 608 | 800 | NK ester A-BPE-20 |
| A-2 | Silicone Acrylate Resin synthesized from Silicone Resin X-40-9225 (manufactured by Shin-Etsu Chemical Co., Ltd.) and 2-Hydorxyethyl Acrylate | 2500 | 5 | 500 | 250 | |
| A-3 | Silicone Acrylate Resin synthesized from Silicone Resin X-40-9225 (manufactured by Shin-Etsu Chemical Co., Ltd.) and 2-Hydorxyethyl Acrylate | 2500 | 10 | 250 | 400 | |
| A-4 | (structure with m + n = 10) | 776 | 2 | 388 | 600 | NK ester A-BPE-10 |

TABLE 6-continued

| No. | Compound | Molecular Weight | Number of Polymerizable Groups | Polymerizable Group Equivalent | Viscosity at 23° C. (mPa·s) | Note |
| --- | --- | --- | --- | --- | --- | --- |
| A-5 | (structure: bisphenol A diacrylate with m+n=4) | 512 | 2 | 256 | 1000 | NK ester A-BPE-4 |
| A-6 | (structure: trimethylolpropane triacrylate) | 296 | 3 | 99 | 110 | |
| A-7 | (structure: 3-(trimethoxysilyl)propyl methacrylate) | 248 | 1 | 248 | 3 | |

TABLE 7

| Compound | Light Absorption Coefficient at 313 nm (ml/g·cm) | Light Absorption Coefficient at 365 nm (ml/g·cm) | Note |
| --- | --- | --- | --- |
| B-1 (structure: bisphenol A diacrylate with m+n=20) | 15100 | 2310 | Photopolymerization Initiator |
| B-2 (oxime ester structure) | 29900 | 6970 | |
| B-3 (4-(methylphenylthio)benzophenone) | 44100 | 10100 | Photopolymerization Initiator |

TABLE 7-continued

| Compound | | Light Absorption Coefficient at 313 nm (ml/g·cm) | Light Absorption Coefficient at 365 nm (ml/g·cm) | Note |
|---|---|---|---|---|
| B-4 | Phenyl-C(=O)-C(CH₃)(OH)(CH₃) | 565 | 73.9 | Photopolymerization Initiator |
| C-1 | 2-hydroxy-4-octyloxybenzophenone | 22100 | 12700 | Benzophenone Ultraviolet Absorber sumisorb130 |
| C-2 | bis(2-hydroxy-4-methoxyphenyl)methanol | 38300 | 51300 | Benzophenone Ultraviolet Absorber Uvinu13049 |
| C-3 | bis(2,4-dihydroxyphenyl)methanol | 38000 | 51200 | Benzophenone Ultraviolet Absorber Uvinu13050 |
| C-4 | 2-ethylhexyl 2-cyano-3-phenylbut-2-enoate | 41900 | 51000 | Cyanoacrylate Ultraviolet Absorber Uvinu13039 |
| C-5 | 2-(2H-benzotriazol-2-yl)-4-methylphenol | 32200 | 5100 | Benzotriazole Ultraviolet Absorber sumisorb200 |
| F-1 | 2,2,6,6-tetramethyl-4-oxopiperidine-1-oxyl | | | Polymerization Inhibitor |

TABLE 7-continued

| Compound | Light Absorption Coefficient at 313 nm (ml/g·cm) | Light Absorption Coefficient at 365 nm (ml/g·cm) | Note |
|---|---|---|---|
| F-2 | | | Polymerization Inhibitor |
| F-3 | | — | Polymerization Inhibitor |

TABLE 8

| No | Compound | Boiling Point | Note |
|---|---|---|---|
| E-1 | $CH_3O(C_3H_6O)_l$–⟨⟩–$(OC_3H_6)_mOCH_3$, $(OC_3H_6)_nOCH_3$ <br> m + n + l = 7-11 | — | Release Agent |
| E-2 | $HO$–⟨$O$⟩$_{11}$–$H$ | — | Release Agent |
| E-3 | Fluorine Surfactant (Capstone FS-3100) | — | Release Agent |
| D-1 | Propylene Glycol Monoethyl Ether Acetate | 146° C. | Solvent |
| D-2 | 1-Methoxy-2-Propanol | 120° C. | Solvent |
| D-3 | Cyclohexanone | 156° C. | Solvent |
| D-4 | Butyl Acetate | 126° C. | Solvent |

E-1 is a mixture of isomers having an average value of m + n + l of 9.
The boiling point is a value measured at 1 atm (= 1013.25 hPa).

EXPLANATION OF REFERENCES

1: substrate
2: curable composition layer for imprinting
2a: patterned curable composition for imprinting (imprinted layer)
2n: mold adjacent portion of curable composition for imprinting
2f: mold lower portion (imprinted curing portion) of curable composition for imprinting
2h: adjacent curing portion
3: mold (template)
3a, 3b: original position of mold
3x: mold protrusion portion
4a: press-contacting direction
4b: mold releasing direction
5a, 5b: pattern (recess portion)
7: light source
6: irradiation light
6a: irradiation light (low exposure dose)
9: shutter

What is claimed is:

1. A curable composition for imprinting that satisfies the following A to C:
   A: the curable composition comprises a polyfunctional polymerizable compound having a polymerizable group equivalent of 150 or higher;
   B: the curable composition comprises a photopolymerization initiator; and
   C: the curable composition satisfies a condition that the content of an ultraviolet absorber in which the light absorption coefficient at a maximum emission wavelength of an irradiation light source is 1/2 or higher of the light absorption coefficient of the photopolymerization initiator is 0.5 to 8 mass % with respect to non-volatile components,
   wherein the ratio of the light absorption coefficient of the ultraviolet absorber to the light absorption coefficient of the photopolymerization initiator is 1/2 to 3/2.

2. The curable composition for imprinting according to claim 1, further comprising:
   a solvent.

3. The curable composition for imprinting according to claim 1,
   wherein the weight-average molecular weight of the polyfunctional polymerizable compound is 1,000 or higher.

4. The curable composition for imprinting according to claim 1,
   wherein the ultraviolet absorber includes any one of a benzophenone ultraviolet absorber, a benzotriazole ultraviolet absorber, or a cyanoacrylate ultraviolet absorber.

5. The curable composition for imprinting according to claim 1, further comprising:
   a release agent.

6. The curable composition for imprinting according to claim 1,
   wherein the content of the polyfunctional polymerizable compound is 50 mass % or higher with respect to all polymerizable compounds.

7. The curable composition for imprinting according to claim 1,
wherein the content of the photopolymerization initiator is 0.5 to 5 mass % with respect to the non-volatile components.

8. The curable composition for imprinting according to claim 1,
wherein in a case where the curable composition for imprinting is applied to a silicon substrate at a thickness of 80 nm and is irradiated with light having a wavelength of 365 nm at an exposure dose of 10 mJ/cm$^2$ in an atmosphere having an oxygen concentration of 3%, a reaction rate of a polymerizable group is 50% or lower.

9. The curable composition for imprinting according to claim 1, that is used for a step and repeat process.

10. A method of manufacturing a cured product pattern using the curable composition for imprinting according to claim 1, the method comprising:
performing an imprinting method through a step and repeat process.

11. The method of manufacturing a cured product pattern according to claim 10,
wherein the curable composition for imprinting is applied to an adhesion layer.

12. The method of manufacturing a cured product pattern according to claim 10,
wherein the curable composition for imprinting is applied to a substrate using a spin coating method.

13. A method of manufacturing a circuit substrate comprising:
the method of manufacturing a cured product pattern according to claim 10.

14. A cured product which is formed of the curable composition for imprinting according to claim 1.

15. The curable composition for imprinting according to claim 1,
wherein the weight-average molecular weight of the polyfunctional polymerizable compound is 2,500 or higher.

16. The curable composition for imprinting according to claim 1, further comprising:
a polymerization inhibitor at a concentration of 0.1 to 5 mass % with respect to the non-volatile components.

17. The curable composition for imprinting according to claim 1,
wherein a maximum emission wavelength of the irradiation light source is in a wavelength range of 250 to 500 nm.

* * * * *